USO08169517B2

(12) United States Patent
Poonnen et al.

(10) Patent No.: US 8,169,517 B2
(45) Date of Patent: May 1, 2012

(54) IMAGE SENSOR ADC AND CDS PER COLUMN WITH OVERSAMPLING

(75) Inventors: Thomas Poonnen, Cortland, NY (US); Jeffrey J. Zarnowski, McGraw, NY (US); Li Liu, Cortland, NY (US); Michael Joyner, McGraw, NY (US); Ketan V. Karia, Cortland, NY (US)

(73) Assignee: Panavision Imaging LLC, Homer, NY (US)

( * ) Notice: Subject to any disclaimer, the term of this patent is extended or adjusted under 35 U.S.C. 154(b) by 903 days.

(21) Appl. No.: 11/974,813

(22) Filed: Oct. 16, 2007

(65) Prior Publication Data
US 2008/0043128 A1 Feb. 21, 2008

Related U.S. Application Data

(63) Continuation-in-part of application No. 11/230,385, filed on Sep. 20, 2005, now Pat. No. 7,518,646, which is a continuation-in-part of application No. 10/106,399, filed on Mar. 25, 2002, now Pat. No. 6,965,407.

(60) Provisional application No. 60/278,639, filed on Mar. 26, 2001.

(51) Int. Cl.
*H04N 5/335* (2011.01)
*H04N 3/14* (2006.01)

(52) U.S. Cl. ........................................ 348/294; 348/302

(58) Field of Classification Search .................. 348/301, 348/302, 294
See application file for complete search history.

(56) References Cited

U.S. PATENT DOCUMENTS

| 5,877,715 | A * | 3/1999 | Gowda et al. ................. 341/122 |
| 6,115,066 | A * | 9/2000 | Gowda et al. ................. 348/308 |
| 6,423,957 | B1 * | 7/2002 | Kim et al. .................. 250/208.1 |
| 6,433,822 | B1 * | 8/2002 | Clark et al. .................. 348/241 |
| 6,982,757 | B2 * | 1/2006 | Tariki ........................... 348/243 |
| 7,456,879 | B2 * | 11/2008 | Lim et al. ..................... 348/243 |
| 7,710,479 | B2 * | 5/2010 | Nitta et al. .................... 348/302 |
| 2002/0067303 | A1 * | 6/2002 | Lee et al. ....................... 341/184 |

\* cited by examiner

*Primary Examiner* — Hung Lam
(74) *Attorney, Agent, or Firm* — Bernhard P Molldrem, Jr.

(57) ABSTRACT

A solid state imager converts analog pixel values to digital form on an arrayed per-column basis. An N-bit counter supplies an N-bit DAC to produce an analog ramp output with a level that varies corresponding to the contents of the counter. A latch/counter or equivalent is associated with each respective column. A clock supplies clock signal(s) to the counter elements. When the analog ramp equals the pixel value for that column, the latch/counter latches the value. The black level can be pre-set in the latch/counter or can be subtracted separately to reduce fixed pattern noise. The pixels can be oversampled for some number of times, e.g., n=16, to reduce the thermal noise of the sensors. Also, two or more pixels sharing a common sense node may be binned together, and two (or more) pixels having different integration times may be combined to obtain an output signal with enhanced dynamic range.

28 Claims, 19 Drawing Sheets

FIG.6A SAMPLE-AND-HOLD
FIG.6B READOUT_CLOCK
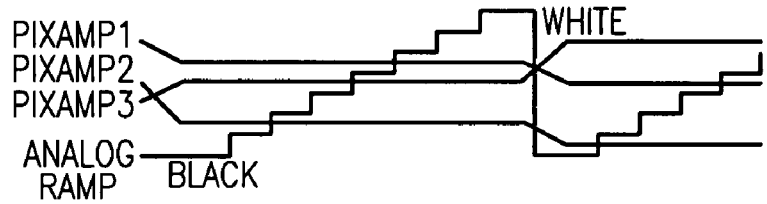
FIG.6C
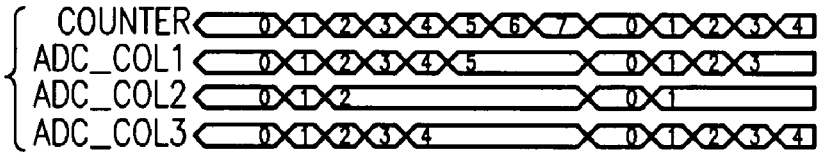
FIG.6D
FIG.6E TRANSFER
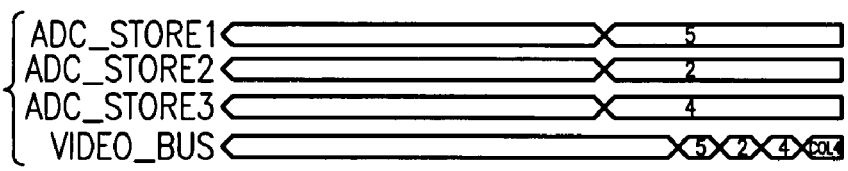
FIG.6F

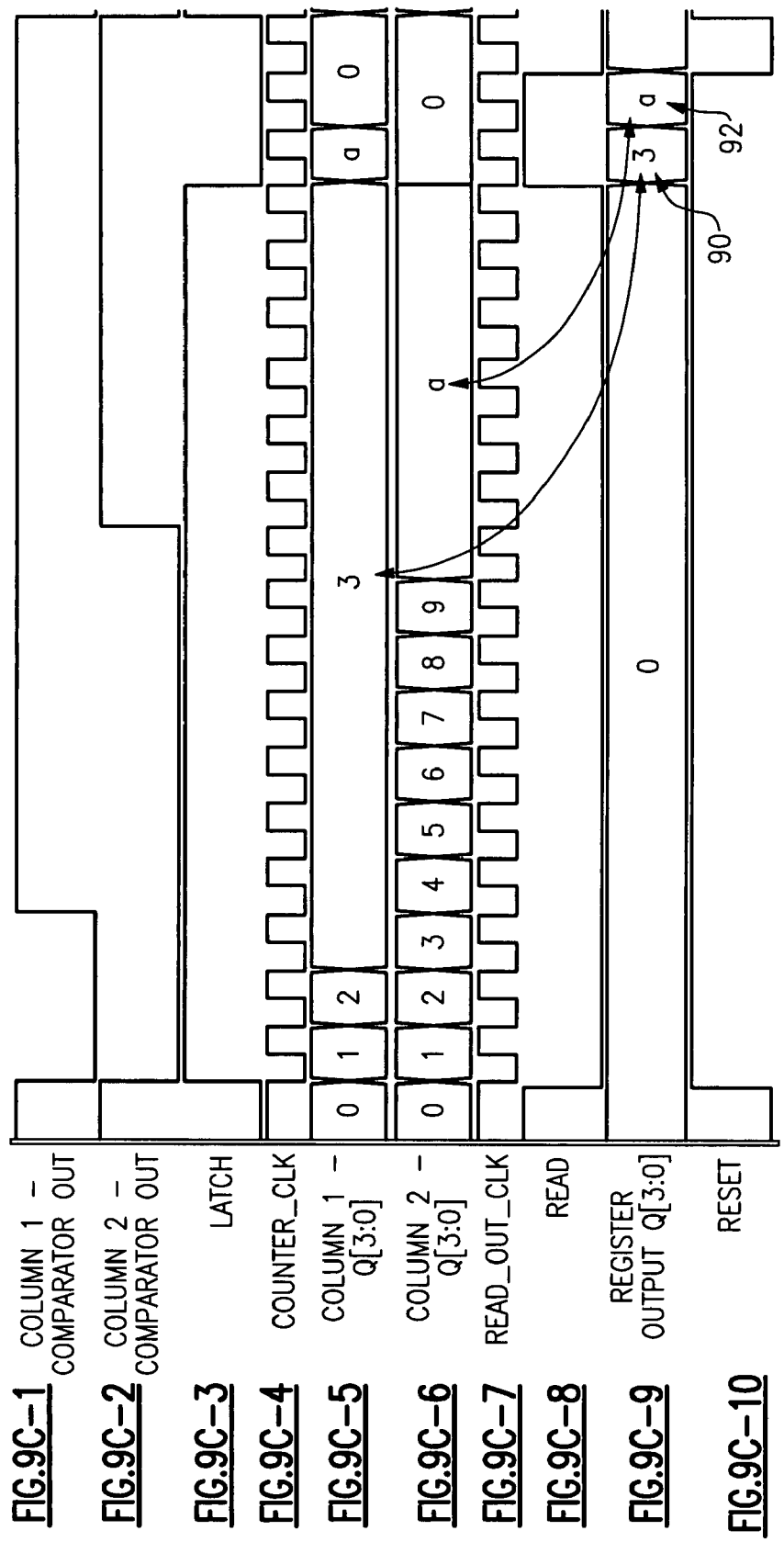

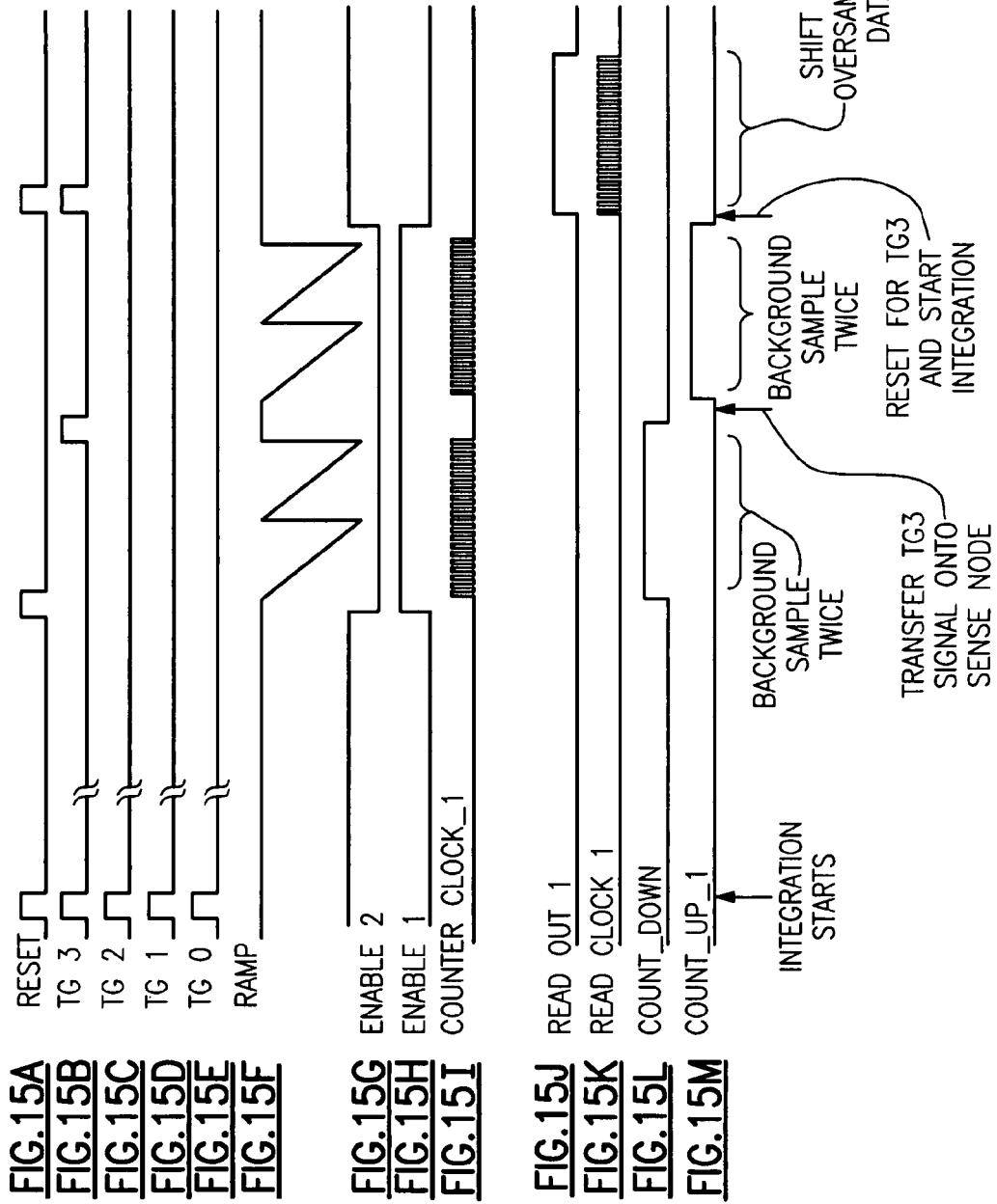

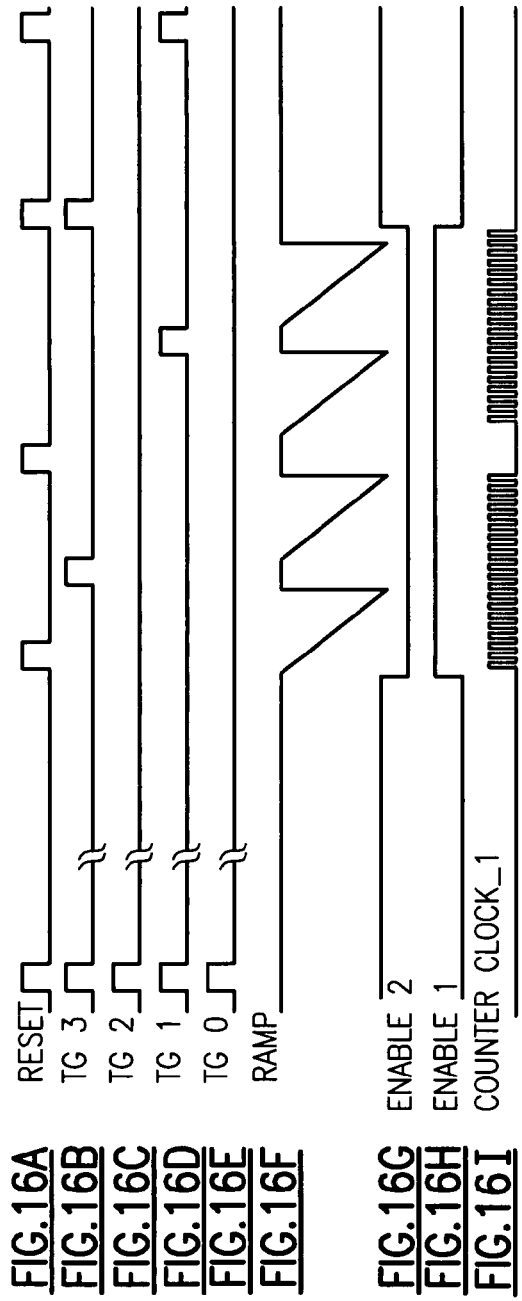

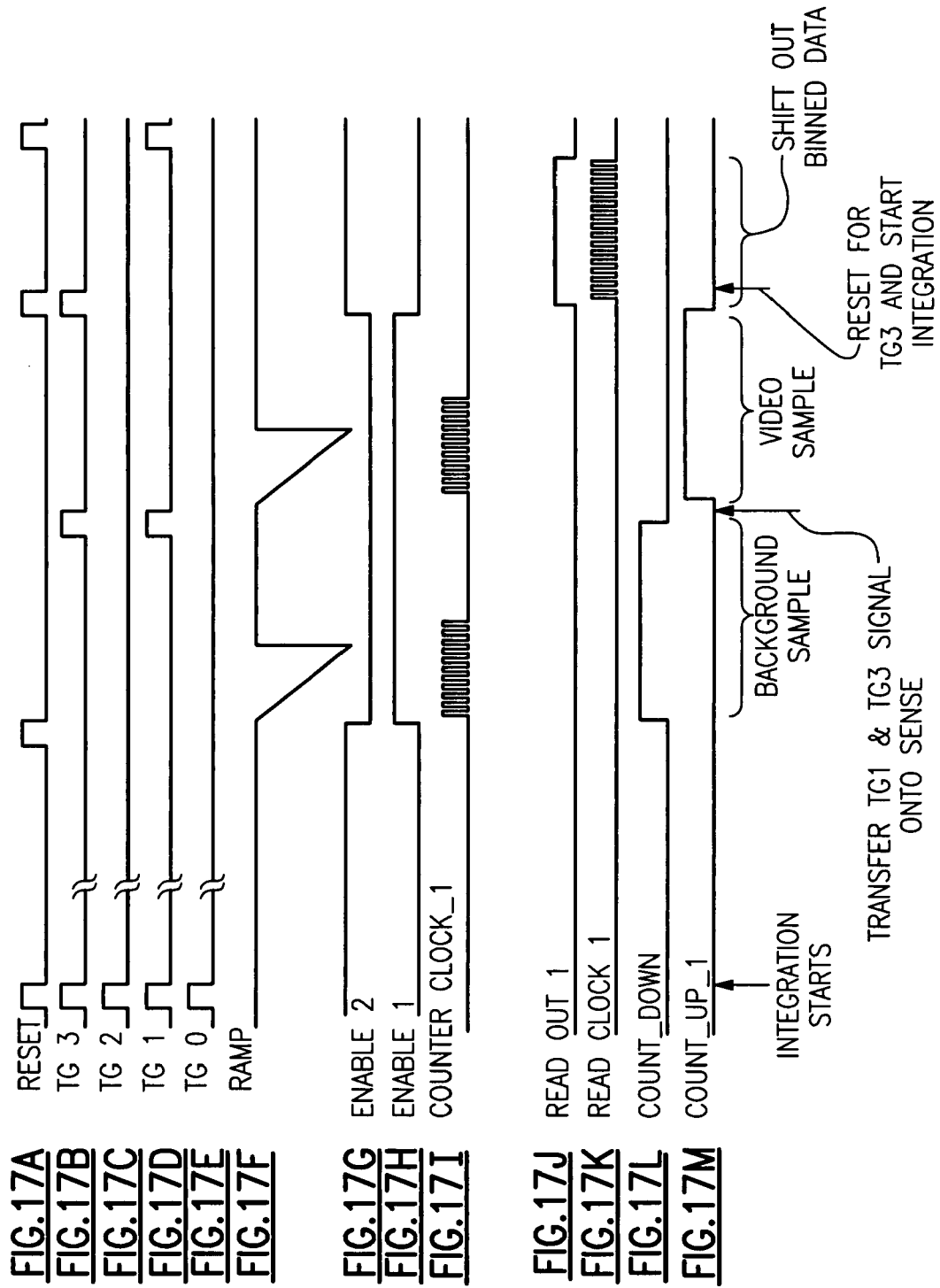

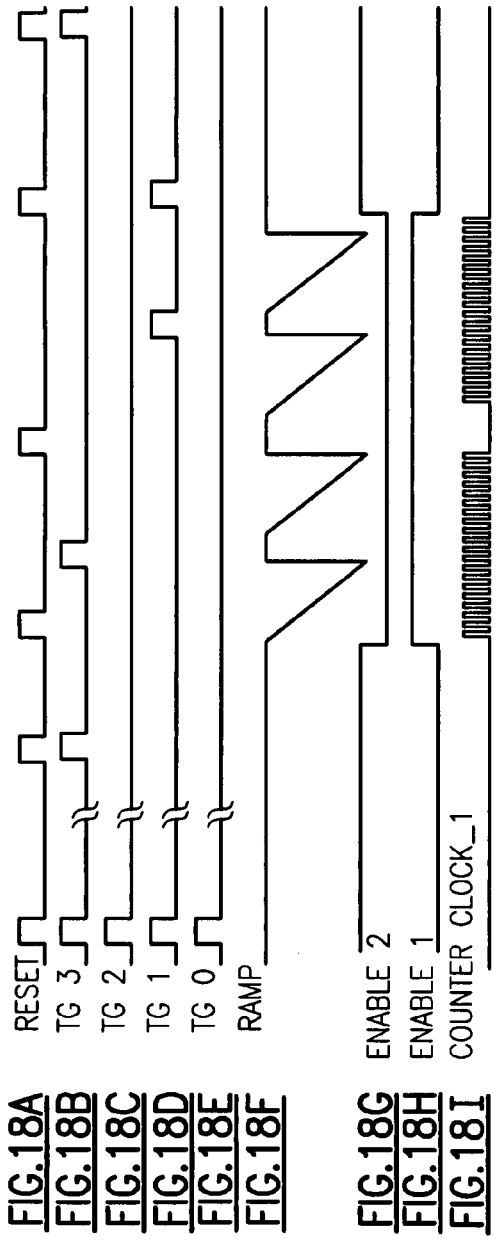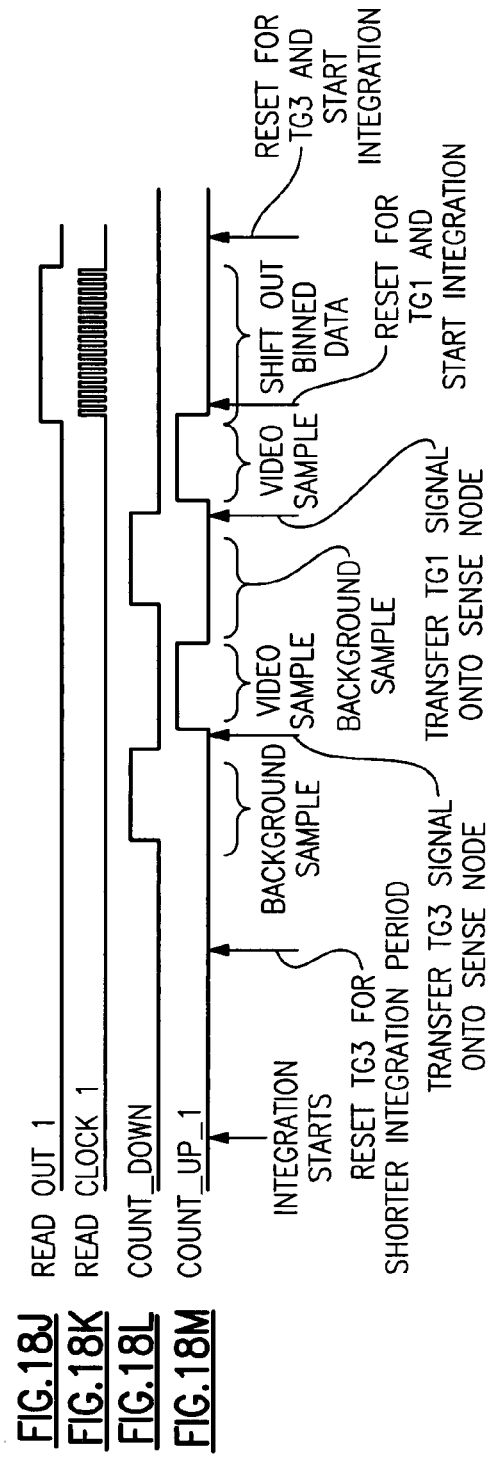

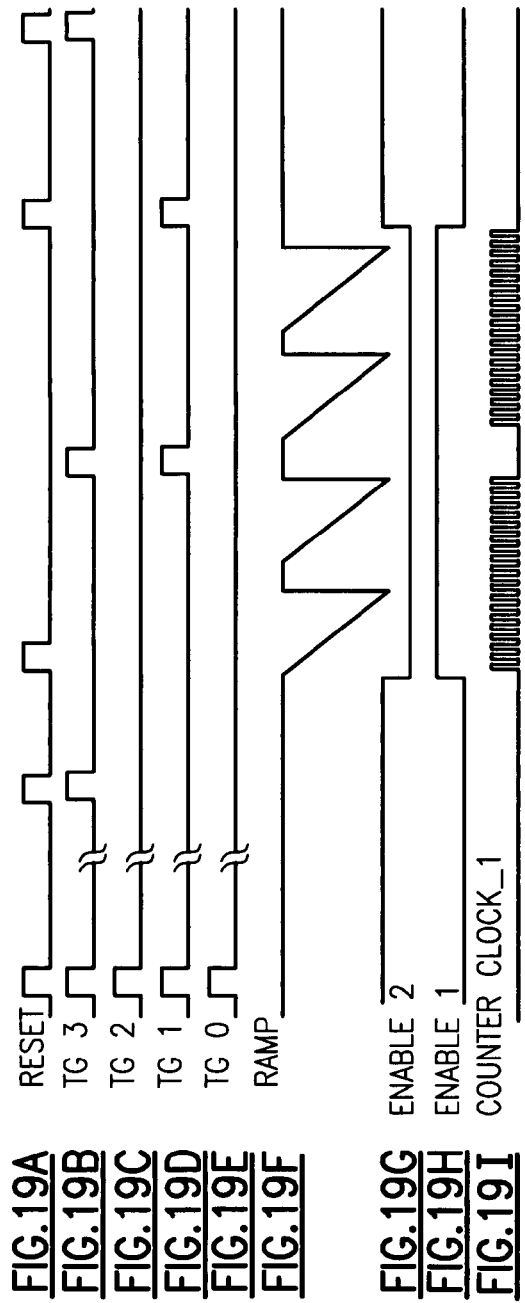
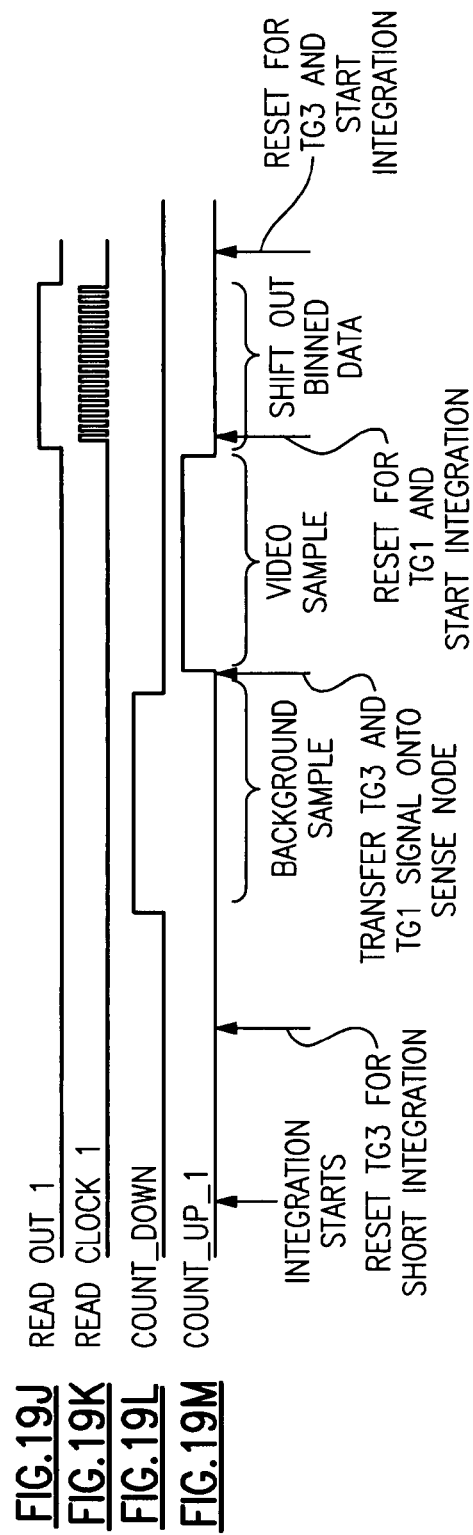

IMAGE SENSOR ADC AND CDS PER COLUMN WITH OVERSAMPLING

This is a Continuation-in-Part of earlier and commonly assigned U.S. patent application Ser. No. 11/230,385, filed Sep. 20, 2005, now U.S. Pat. No. 7,518,646 which is a Continuation-in-Part of application Ser. No. 10/106,399, filed Mar. 25, 2002, now U.S. Pat. No. 6,965,407, which claims priority of Provisional Application Ser. No. 60/278,639, Mar. 26, 2001, now abandoned.

BACKGROUND OF THE INVENTION

This invention relates to solid state imaging devices, and is more specifically directed to an imager that converts analog pixel values to corresponding digital values on an arrayed basis, with significantly reduced circuitry. The invention is also concerned with compensation of errors that may be present in conversion, as well as correction for offset errors attributable to the pixel photo sensor areas or to the pixel amplifiers.

The invention is also concerned with a distributed analog-to-digital converter arrangement, i.e., distributed one per pixel, which allows for oversampling of pixel data to remove temporal noise for increased sensitivity, and which allows for dual sampling and binning to enhance dynamic range.

DESCRIPTION OF THE PRIOR ART

The term "array" used herein refers to any kind of repeatable circuit and covers, for instance, a circuit per column or a circuit per row in an area (two-dimensional) sensor, or an entire line in a linear sensor (theoretically, a one-pixel by n-pixel area sensor). Alternatively the term "array" could embrace every pixel in an image sensor.

A dominant factor in integrated circuit design is the silicon area utilized for a given circuit implementation and thus good circuit design requires minimizing the size of any circuit as much as possible. Any kind of arrayed circuit is a major contributor to the overall utilized silicon area, so for large arrays it is advantageous to reduce the amount of arrayed circuit. There is continuing higher demand for solid state imagers with a reduced power consumption, increased readout speeds, smaller line intervals, higher sensitivity in the pixel amplifiers, lower FPN (fixed pattern noise), higher signal to noise ratios (SNR) and denser pixel-pitches (and thus also array-pitches).

The majority of the present-day image sensors designs employ one or more analog bus(ses) in order to sequentially scan the signals stored in a very large array. Wide-bus analog multiplexing has significant problems due, for example, to highly capacitive loads, long settling times, voltage drop across the bus, noise cross-coupling from neighboring circuits. At the same time, the highly capacitive bus is driven by a circuit with an analog supply that will suffer from the sudden surge in analog current while changing the voltage on the bus to the newly selected pixel. That surge in the analog current can inject a significant amount of noise to the highly sensitive pixel site or pixel amplifier voltage storage nodes. Finally, if the arrayed analog buffer has to be able to drive the capacitive bus (even at moderate speeds) it will need a higher quiescent supply current in the output stage and that current gets multiplied by the number of arrayed elements to yield a very high undesired power consumption for the entire array.

If A/D-converter digitizing could be implemented per arrayed circuit, the video bus multiplexing can be done in the digital domain with sharply improved noise immunity, as compared to an analog bus. There are many other advantages inherent in a digital video multiplexer as opposed to an analog video multiplexer; for example, digital logic has significantly smaller transistors, with no quiescent power consumption; there are no mismatch issues which might lead to added fixed pattern noise (FPN); and digital circuits provide excellent capacitive driving capability and an additional ability to do pipelining for increased speed.

A serious problem for analog arrayed circuits is that any mismatch between the devices will appear as fixed pattern noise (i.e., offset variations from one circuit in the array to the next). As the pixel pitch decreases the analog array pitch decreases as well, and any asymmetry in the array will show up as FPN. As the analog array pitch decreases it becomes difficult or impossible to achieve proper device matching by the usual technique making large devices, placing them in proximity and utilizing dummy devices in order to make dependant devices similar in their electric parameters. This problem, however, would be absent in digital implementations.

Gain variations in CMOS and other solid-state analog imaging devices are virtually eliminated using an Active Column Sensor (ACS) approach (See U.S. Pat. No. 6,084,229, Jul. 4, 2000). Offset errors are cancelled out from the arrayed devices using a correlated double sampling (CDS) technique, where the pixel reset (black-level voltage) is subtracted from the sampled video voltage. Any common-mode errors present within the arrayed circuits are thus compensated. Conventional CMOS imagers do not use true CDS, in which the reset voltage is sampled before exposure and is subtracted from the video signal sampled after the exposure. Instead a DS (double sampling) is used, where the video signal is sampled after exposure, the pixel is reset and the reset voltage is then sampled and subtracted from the sampled video signal. True CDS eliminates the thermal or temporal (kTC) noise arising from resetting the pixel and also eliminates offset errors in the amplifiers and pixels. DS eliminates offset errors but also introduces $\sqrt{2}$ times more kTC noise (rms). Straightforward DS is often justified economically, in practical implementations, because offset errors which appear as FPN are more degrading to the perception of a scanned image than the randomized kTC noise.

Prior arrayed A/D-converters typically employ a Successive Approximation Register (SAR) technique, that uses a bisectional search algorithm to find the digital pixel value (see, e.g. U.S. Pat. No. 4,978,958). An N-bit SAR Analog-to-Digital Converter (ADC) is for instance constructed from an N-bit Digital-to-Analog Converter (DAC), or similar device, a comparator, a controller and one or more N-bit registers per arrayed element. Thus the SAR ADC suffers deficiencies with respect to size, accuracy and power consumption. An N-bit SAR ADC can digitize to an analog signal in $2^N$ clock cycles compared to an N-bit Flash or pipelined flash that digitizes the signal in one or a few clock cycle(s). These clock cycles add to the line-period when digitizing the signal before read-out.

An objective of this invention over, for instance, the ADC of U.S. Pat. No. 3,683,369 is to achieve a particular benefit over arrayed A/D-converters by minimizing the number of arrayed analog devices needed. Also, the analog ramp in this invention is generated by a non-arrayed DAC with the input to the DAC being a digital count, rather than the less accurate method of relying on the time from the start of an analog generated ramp and until the ramp has passed the analog input voltage.

An attempt to minimize the power and size of arrayed ADCs over conventional SARs is discussed in U.S. Pat. No.

5,880,691, where the DAC is made from various sized capacitors and was intended to achieve a significant reduction in power consumption. However, this is still an SAR design, and consumes much of the available device area.

U.S. Pat. No. 3,961,325 discusses advantages of arrayed A/D-converters by using a ramp to feed an array of single comparators, but is focused on means of controlling an analog generated ramp so that it is in sync with a binary counter. Unlike the present invention, the ADC of the prior patent cannot rely on a single DAC to generate the ramp from a single counter, and cannot have the very same counter value latched throughout in all the array circuits as the digitized values. Synchronization has been a serious problem, whereas proper synchronization is a given in this invention. With the prior techniques, it is difficult to reduce the size of the analog portions of the digitizing circuitry. However, in this invention, the analog part of the arrayed circuits can be made as small as possible with higher offset error variations allowed, and the absence of properly matched analog devices in the array ceases to be a problem.

Dynamic range extension and/or enhancement has been described, e.g., in U.S. Pat. No. 6,115,065 granted to Yadid-Pecht et al. The approach discussed there employs a column-parallel read out, and reads the same row of data with different integration times. Then the various pixel read outs, with different integration times, are combined with one another, followed by a subsequent video processing. That technique requires temporary storage of intermediate information, so as to permit the combining of the pixel information with the different integration times, thus creating additional system complexity. The technique of that patent also has the problem that the readouts for the same pixel will have non-overlapping integration times, leading to image blur when the different integration periods are combined. The technique of U.S. Pat. No. 6,115,065, which is apparently the prevailing technique in use, misses out on any benefit that could have been obtained from the digitization technique of our earlier U.S. Pat. No. 6,965,407, in which the pixel information is digitized without first sampling the pixel values.

In the Distributed Analog to Digital Converter per pixel arrangement as described in U.S. Pat. No. 6,965,407 and in Published Application US 2006/0012696, an N-bit counter supplies an N-bit DAC to produce an analog ramp output that varies corresponding with the contents of the counter. This may be constituted as a ripple counter, formed of an array of flip flops. A comparator in each column gates the counter when the analog ramp equals the pixel level, and then the contents of the counters are transferred sequentially to a video output bus. To counter fixed pattern noise, a stored digital value that corresponds to a black level can be subtracted out for each column. With the ripple counter arrangement, the same flip flops that are employed as counters can also be used as shift registers to clock out the video levels to the output bus.

OBJECTS AND SUMMARY OF THE INVENTION

Accordingly, it is an object of the present invention to provide a straightforward technique for converting the video pixel signals from a solid state imaging device to a digital video signal, and to achieve the same effect on-chip with an array that consumes a minimum of available area, and which avoids drawbacks of the prior art.

It is another object to provide a solid state imager with an arrayed ADC functionality, and which also compensates for offsets and eliminates or reduces FPN.

Another object is to improve the signal to noise ratio (SNR) of sampled signals, by providing a simple means for over-sampling the signal using a simple counter for each column to develop and store the digital value corresponding to the column pixel value.

It is a further object to provide for oversampling and binning, using different integration times, in a way that increases contrast in both the dark areas and the bright areas of the image.

It is an associated object to increase picture quality for images by expanding the effective dynamic range of the digital image produced by the imager.

According to a preferred embodiment of this invention, an ADC arrangement converts analog pixel values from an array of pixels to a digital video signal. The array is formed, for example, of a plurality of columns and at least one row, with each column having at one pixel, and with each column having a column amplifier that provides a respective pixel value. In the ADC arrangement there is an N-bit counter; an N-bit DAC connected to the counter output, with the DAC providing a ramp output signal proportional to a count existing on the counter. A plurality of simple counters, i.e., asynchronous counters or ripple counters, are each associated with a respective column. A plurality of comparators are each associated with a respective one of the column amplifiers, and have one input connected to the respective column amplifier, another input connected to the ramp output of the N-bit counter, and a comparator output. The comparator output and the clock signal are applied to inputs of a logic element, e.g., a NOR or a NAND, and this supplies clocking signals to a clock input terminal of the respective ripple counter. The ripple counter continues to count up (or down) until the comparator senses that the ramp voltage equals the video level of the column amplifier. A video readout bus follows these ripple counters/latch elements, and a switch array or other equivalent means selectively transfers the contents of the ripple counters to a video output bus to produce the digital video signal. In this invention, each signal in the array is compared with a common ramp, and the comparator output is used to stop the counters at a digital count value that corresponds to that ramp level when it equals the video signal level of that column. Bringing a video readout into the digital domain presents a myriad of advantages such as higher speed, lower noise and lower power. The invention also presents a variety of digital readout schemes with different speed/size tradeoffs and means to do DS and even true CDS in the digital domain to compensate for offset variations in the array. Compensation for offset errors can be easily achieved, including errors that arise from the conversion in addition to offsets between pixel amplifiers.

The ADC arrangement can compensate for fixed pattern noise (FPN). To this end, a plurality of black-level readout column counters/latch elements are each associated with a respective one of the columns. Each black level readout counter/latch element may have a clock input terminal connected to the respective comparator output. The count on this black-level column counter/latch element may be applied to a black-level readout bus, and associated circuitry transfers the contents of the respective black-level counters/latch elements to the black-level readout bus simultaneously with the transfer of the contents of the first-mentioned counters to the video readout bus. A subtraction element connected to the video readout bus and the black-level readout bus then subtracts the black-level values, to eliminate offset as between the column amplifiers. In one preferred mode, the counters/latch elements may each include a first counter arrangement having an input connected to the comparator, and a second, buffer counter arrangement, with an input connected to an output of the respective first counter arrangement, a gate terminal, and an output connected to the video readout bus. In this case the buffer counter is electronically reconfigured from a counter to a latch in order to transfer the digital video output. Alternatively, the counter arrangement may be configured to count in one direction to reach a value corresponding to the black offset value, and then count in the other direction to reach a value corresponding to the column video level, so as to automatically compensate for any variation in black offset from one column to another. The counter per column configuration would involve selectable up/down counters.

The column counters can be used for re-sampling or oversampling of the image during a video readout phase. Each counter would require an additional number of bits equal to the log(base 2) of the number of oversamplings. That is, for a 12-bit sample per column, if each signal is sampled twice per video readout, then the counter would require 13-bit capacity, for four oversamplings the counter would require 14-bit capacity, etc. For example, if each sampling could have a value from zero to 4095, and the counter is used to count up to 4096 possible values twice, there is a need to store up to a total value of 8191. The counter would hold the total of the two sample values, and a choice can be made to use the stored value as gain or as noise reduction. The asynchronous counter stores the value as a binary value, and if a whole binary oversampling is used, the number of times each column is sampled would be 2, 4, 8, 16, etc., and no further mathematical operation is needed to divide the count back down to the 12-bit level. (Only the upper 12 bits are used, and the lowest two bits are not read out. This in effect is a divide-by-two (or divide-by-four, etc.) operation.) Alternatively, for low light level operation, the twelve least significant bits can be read out following oversampling. By oversampling, the random noise present for a given sample will be compensated for by the other samples, so that in effect the signal-to-noise ratio improves by the square root of the number of samples, i.e., by a factor of 4 in the case of sixteen samples.

In the arrangement of Publication US 2006/0012696, in which an array of D-flip flops is configured as a ripple counter, the transistors are reused from collecting the representative pixel data, temporarily storing the data and then shifting the data out directly, eliminating the need for a video bus and for separate shift registers from the ones used to determine the collection of data. If these are arranged with two or more sets of latches per column, the second set or sets can be used to mirror the data for read out in a pipeline manner. This eliminates any timing overhead, and makes it possible to obtain a maximum throughput. Also, if there is more than one storage site per column, or if the storage per column can be reused, as in the case of up/down counters, then multiple samplings of the pixel data can be taken and stored, which reduces temporal noise. This process is known as oversampling.

In a similar process, instead of conducting oversampling of the same pixel, nearby pixels can be sampled onto the same set of latch/counter/shift register arrangements, so that the contents of the different pixels are binned together. This can be done at the same time or at different readings. If the different pixels that are sampled and binned have different integration times, then the binned data will have enhanced scene dynamic range. This is a straightforward process to achieve, when using a distributed analog to digital arrangement, but would not achieve great benefits if conducted according to standard techniques where the pixel levels are sampled and stored on a capacitor. In the case in which analog sampling is used, the very act of sampling the pixel level adds kTC noise (random thermal noise) and degrades the pixel data. Oversampling has the greatest benefit when the pixel levels, i.e., pixel data, have not been sampled and stored on a capacitor. With the technique employed in this invention, the information is digitized directly without first sampling the pixel levels, so multiple readings of the same pixel values are possible without signal degradation.

Enhanced scene dynamic range occurs when the imager can combine a larger range of scene illumination than can be captured with the dynamic range of a single read from each pixel. Enhanced dynamic range allows the fine detail to be seen by mathematically combining pixels with different integration periods. The effect of dynamic range enhancement is to allow the captured images to show detail from one integration period that would not appear in the other (longer or shorter) integration period. This is the case whether the second pixel is completely saturated or is only thinly exposed. Dynamic range enhancement permits captured images to show detail from one integration period even if the second integration period is longer and the second pixel to be combined is clipped at saturation. For example, if one pixel for a given integration period of time X is at 80% of saturation and another pixel, that will be combined with it for dynamic range enhancement, has an integration period of time 4×, the other pixel will be at 320% of saturation but the output will be clipped at 100% of saturation. The two pixels combined, assuming a linear response and using the same gain per pixel, will be at 90% of saturation, i.e., ½×(100%+80%), and thus will be able to show detail in that region. In this same manner the pixels with the longer exposure time (i.e., integration time of 4×) will have a long enough integration time, and a sufficient number of photon-generated carriers, to bring out details in the darker regions of the scene so that the shadow detail is captured as well.

The oversampling for gain or noise reduction for each pixel of a selected row can also be done for two or more rows on the same counter, thereby summing up the video level for two different rows. This allows for digital summing of pixels in two or more different rows and allowing for gain and noise reduction with oversampling. There is a trade-off in terms of lower resolution if the pixels are not readout between summing the two rows, but this is frequently outweighed in terms of user benefit, namely, greater dynamic range. In some applications, such as those where the imager resolution exceeds the display capabilities available to the user, there will be no loss of displayed resolution and enhanced dynamic range, and the field of view will remain that of the entire imager. This is advantageous in many applications, as unwanted pixels are removed to fit the display capabilities. With this capability to sum pixels, few or no pixels will be removed to fit the display. With the ability to sum different rows on the imager and with the ability of CMOS/MOS imagers to address and reset pixels in any sequence, very different integration times can be applied to the various rows selected, providing the capability of still further enhancement of dynamic range. For example in scenes where there are very bright regions, such as car head lights, some of the pixels can quickly become saturated and detail is lost. If two different rows, and usually adjacent rows, are given different integration times, i.e., one row having a very short integration time and another row having a typical integration time, the two rows can be summed and still have detail which would have been lost with pixel saturation. The term adjacent, as used here, can depend upon the application and the type of color filters arrangement employed. For a Bayer color arrangement the adjacent pixels for pixels with red filters, for example, are actually two rows apart for the same column. For striped color filter arrangements, the adjacent pixels would usually be physically touching each other. In effect, the slope of the DAC output ramp can be programmed so that the slope is different for different rows of pixels.

A preload count separate from the sampling of the background reset value or the pixel level can be added or subtracted from the count per column as a positive or negative offset in the resulting video per column, to assist with the quality of the image when displayed. Thus, this preload offset can be utilized to adjust the video brightness and white balance of a color imager. Also, by loading a predetermined count as a preload value to the latch/counter/shift register, it is possible to verify the latch/counter/shift register functionality, and the preload value can be utilized as a test feature.

Also, as the digital-analog converter or DAC is often programmable, the user can change the ramp gains between reads of the same row or between different rows to match color sensitivities or enhance the DAC ramp range for low and high light level images. The imager can generate one ramp or two or more ramps in parallel. This can use multiple DACs or a single programmable DAC. If multiple ramps are needed by the application, then ramp gain can be adjusted for pixels of different colors filters, but where application size and power limitations permit only a single DAC, then DAC ramp output can be split into two or more ramps in parallel. This can involve buffering the ramp signal with different gains that can be separately programmable if required. The buffering can be accomplished with simple programmable source follower circuits or programmable operational amplifiers.

In another embodiment, the counter architecture permits an array of flip-flops, i.e., a DFF array, as ripple counters during pixel sampling, and then as shift registers to clock out the stored data in sequence, i.e., as a sequential digital output bus.

The use of flip flops configured as ripple counters permits the processing circuitry of the digital imager to be constructed as simply as possible with a minimum of active elements and a minimum of metallized conductors, thus occupying as small an area of semiconductor material as possible.

The invention can be carried out employing binning, by selection of two or more pixels on the same sense node, with separate photodiode samplings. Also, binning can be carried out by selection of two or more pixels on the same sense node with pinned diodes and photogates, using one sampling for background and one sample for pixel information. Binning may be carried out by selection of two or more pixels on different sense nodes, which pixel values are later then combined on to a single readout.

Oversampling is carried out by selection of a sense node, and by sampling and resampling the pixel sense node and pixel directly (without requiring a sample-and-hold circuit).

Dynamic range enhancement of two or more pixels can be carried out, with the two pixels having different integration periods, but with the two pixels sharing a single column readout. This technique of dynamic range enhancement can also be carried out by combining onto a common readout the outputs of two pixels, with different integration times. Dynamic range enhancement can be carried out for two pixels with different integration times and being positioned under the same microlense.

The principles of this invention can be implemented on a pixel array in which different columns may be coupled to the same sense node. In other possible implementations other may be more than one sense node in a given column. To that end, any reference herein to a column or to pixels in the same column should be interpreted to include pixels in different columns that may be switched to a common sense node.

The above and many other objects, features, and advantages of this invention can be achieved and will become apparent from a consideration of the following description of selected preferred embodiments, which are to be read in connection with the accompanying Drawing Figures.

BRIEF DESCRIPTION OF THE DRAWINGS

FIGS. 6A to 6F are signal charts for explaining the operation of this embodiment.

FIG. 9C-1 to FIG. 9C-10 are signal diagrams for explaining the operation of the counter/latch elements as shown in FIGS. 9A and 9B.

FIG. 10 and FIG. 11 are charts for explaining non-linear implementations of this invention.

FIG. 15A to FIG. 15M are signal diagrams for explaining the operation of the circuit of FIG. 14.

FIG. 16A to FIG. 16M are signal diagrams for explaining timing for binning of two or more pixels for standard photodiode technology.

FIG. 17A to FIG. 17M are signal diagrams for explaining pixel timing, with binning of two or more pinned pixels, employing photodiode or photogate technology FIG. 18A to FIG. 18M are signal diagrams for explaining dynamic range enhancement with pinned photogate or photodiode pixels, using different gains or digitizing algorithm on long and short integration times.

FIG. 19A to FIG. 19M are signal diagrams for explaining dynamic range enhancement oversampling with pinned photogate or photodiode pixels, using same gains or digitizing algorithm on long and short integration times

DETAILED DESCRIPTION OF THE PREFERRED EMBODIMENTS

Figure 1:
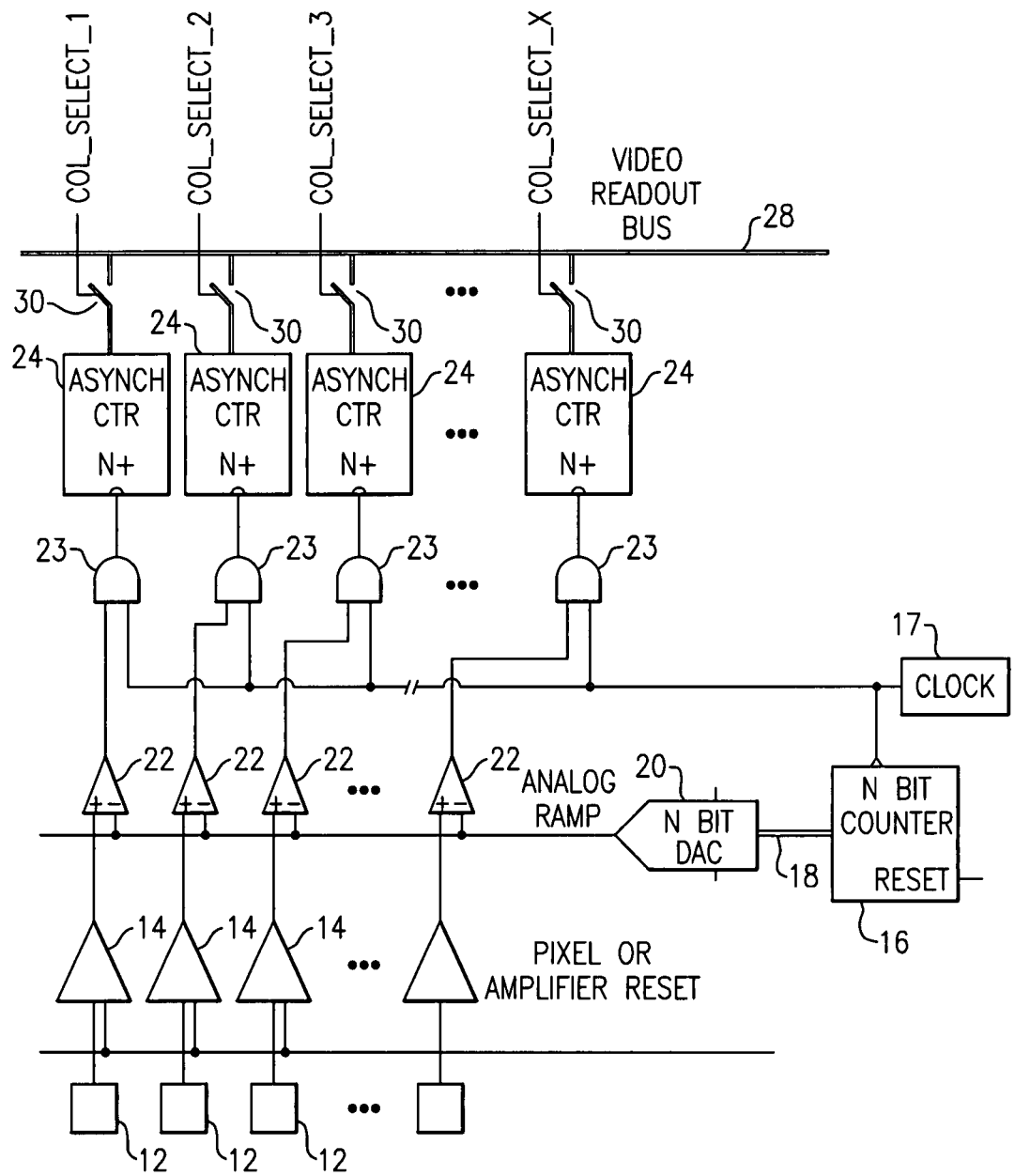
FIG. 1 is a schematic circuit diagram of a solid state imager employing an arrayed ADC according to one preferred embodiment of this invention.

With reference to the Drawing figures, and initially to FIG. 1 thereof, an arrayed solid-state imager 10 is shown, which incorporates an N-bit ADC conversion facility that employs an N-bit counter and a DAC to generate an analog ramp.

In this imager 10, there are multiple columns, each comprising one or more pixels 12. In this case the pixel 12 represents one or multiple pixels of the same column, and each pixel 12 is connected with an input of a column amplifier 14. A pixel reset line is also connected to a reset input of each of the column amplifiers 14. An N-bit counter 16 counts up clock signals that are supplied from a clock pulse generator 17, and the counter 16 supplies a digital count value on a counter output bus 18 that supplies an input of a DAC or digital-to-analog converter element 20. For simplicity, the same clock pulse generator 17 is used for both the counter/latches 24 and the DAC 20. The user may employ different clock pulse generators to add flexibility. The clock generators may have different frequencies, yet be operational at the same time. In this embodiment a low count value corresponds to a video dark or black value, while a high count value corresponds to white. The DAC 20 creates a ramp voltage output that steps up incrementally with each count, and then cycles or resets and generates another ramp. Not shown for simplicity is the reset signal to latch/counter elements. Each column has a comparator 22 with each comparator 22 having one input receiving the ramp signal AnalogRamp from the DAC and another input receiving the analog pixel value from the associated pixel amplifier 14. The comparator 22 changes state, e.g., from "0" to "1", as soon as the ramp signal level equals or exceeds the pixel voltage from the associated pixel amplifier 14. For each column there is a logic gate 23 with one input fed by the comparator 22 and one receiving clock pulses from the clock generator 17. Each column also has a column counter/latch circuit 24, which can constituted be a simple ripple counter or asynchronous counter, with a clock input coupled to the output of the logic gate 23. The column counter/latch circuits 24 each count up until the logic gates 23 input from the comparator 22 changes state, after which the clock signals are blocked by the logic gates and the column counter holds a value corresponding to the count on the N-bit counter 16 at the moment that the ramp voltage equals the pixel voltage. Then the count for each column is transferred as a digital pixel value, column by column, to a video readout bus. Column select switches 30 are gated one at a time in response to respective column select signals, so that the digital signal appearing on the readout bus 28 corresponds to the analog value of the video provided by the respective pixels. This digital video signal has numerous advantages as mentioned before over analog video processing.

The analog ramp is generated by counter 16 and N-bit DAC 20 and is compared to the video voltage from the pixel amplifiers throughout the entire array. Each comparator 22 makes the associated column counter/latch 24 transparent if the analog ramp voltage is below the pixel amplifier signal, so that when the analog ramp has passed the particular pixel amplifier voltage, the corresponding column counter/latch 24 holds the count value that was present when the ramp voltage was equal to the amplifier voltage. In this digitizing scheme conversion time of 2N cycles is required, as compared to N cycles in a SAR-DAC. Glitch removal (to prevent latching when the counter is changing) is not shown in this diagram.

The comparator 22 can be a simple open loop operational amplifier, but preferably have a registered structure or hysteresis to avoid noise jitter on the output to accidentally latch the column counter/latches 24 during counter transitions which may cause erroneous conversion. Alternatively, the comparator functionality can be performed by a modification to the ACS buffer or to other amplifier structure. It is beyond the scope of this invention to present modern comparator structures that minimizes comparator offset errors (output transitions at a fixed voltage difference between the negative and positive inputs) or avoids output jitter (comparator output transitions when inputs are stable due to temporal or system noise). In this context, a comparator can be any means of comparing two voltages to produce a controlling signal. The pixel or column amplifier 14 is intended to reference any single pixel or column of pixels that provides a voltage or sequence of voltages corresponding to the amount of incoming light during the exposure time.

As mentioned before, the pixels 12 in the array can physically be one pixel or a column of pixels feeding the associated column amplifier 14 that converts the signal from the pixels to a voltage. The amplifiers 14 (or alternatively the pixels 12) can be reset to a black level, and sampled-and-held to maintain a constant output voltage independent of the incoming light. The comparators 20 compare the held voltage to the analog ramp voltage and their outputs controlling a respective one of the digital counters/latches 24. The comparator output is applied as a latch-enable, LE. If LE is low, the counter/latch 24 is transparent according to the implementation above. The counters/latches 24 can be sequentially read out after the conversion has been completed on a digital video bus by pulsing the Col_Select signals in the correct sequence.

Figure 2A:
FIGS. 2A to 2D are signal charts for explaining the operation of this embodiment.
Figure 2B:
Figure 2C:
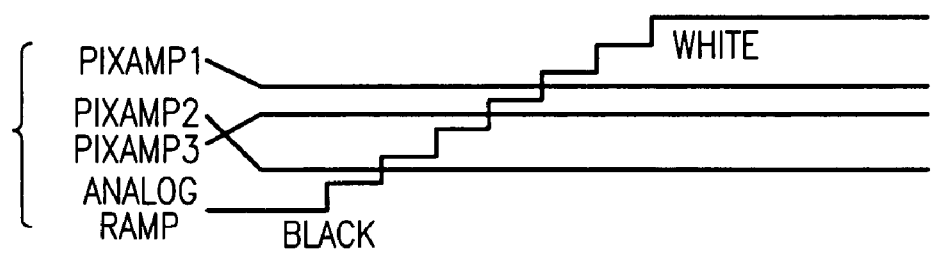
Figure 2D:
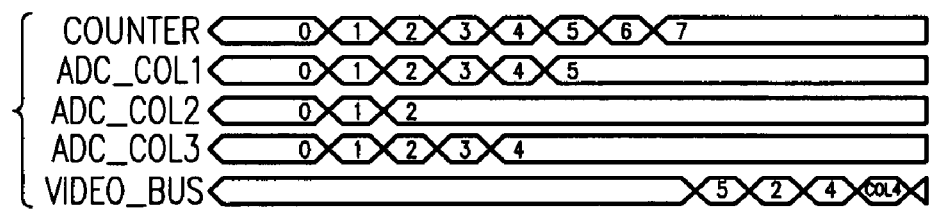

The operation of this arrangement can be explained in FIGS. 2A, 2B, 2C and 2D. These charts show schematically, and on a small scale, the operation of the imager 10, and the waveform diagrams show an example of a 3-bit ADC where three amplifier voltages "PixAmp" are sampled-and-held to maintain a constant voltage. A sample-and-hold signal (FIG. 2A) is applied to the pixel amplifiers 14. All the pixel amplifiers 14 across the array change during the time of that pulse to their new pixel value. Once the amplifier voltages are held, the counter starts counting from 0 to $2^N-1$ and the resulting ramp voltage (AnalogRamp—FIG. 2C) is compared to the held voltages throughout the array to latch the counter value. In the example above, three of the amplifiers output respective pixel voltages, namely PixAmp1, PixAmp2 and PixAmp3, as shown in FIG. 2C, and these digitize respectively: PixAmp1 digitizes to "5", PixAmp2 to "2" and PixAmp3 to "4". External gating (or timing), as shown in FIG. 4D, of the "LE" will determine if the counter value before or after the ramp has passed should be locked in and at the same time prevent glitches from skewing of a count that is in the process of changing (not shown). Once all $2^N$ cycles of the A/D-Conversion has completed, the contents of the counters/latches can be sequentially read out on the resulting video bus (shown as Readout_Clock—FIG. 4B).

One of the major problems in image sensors is fixed pattern noise or FPN, which is due to fixed offset variations. According to another aspect of this invention, a scheme for reducing or eliminating FPN is presented here which re-utilizes the very same portions of the circuit for compensating for those offset variations. The amplifier voltages can be considered as a sum of the video signal, the black level and FPN. Where the video signal is dependent only on the light on the pixel, the black level is constant throughout the array, and FPN is the variation in offsets across the array. When the pixel is reset, the video signal gets removed from the sum that constitutes the pixel output. The black level plus offset at the time of reset can be subtracted from the respective pixel output to compensate for the offset and thus remove the FPN. This can be carried out digitally by taking the digital value of the pixel output and subtracting the digital value of the offset. The FPN is of far smaller dynamic range than the video signal, so if the A/D-conversion is run again after the pixels or amplifiers have been reset, the FPN can be latched separately and digitally subtracted from the digitized video during read-out. The FPN digitizing can be carried out in a significantly smaller number of clock cycles. One of the major benefits to the lower dynamic range of the FPN is that the counter only has to make a ramp from black−FPN/2 to black+FPN/2 and therefore uses a small fraction of N bits, i.e., "M" in the diagram below, where M<<N.

Figure 3:
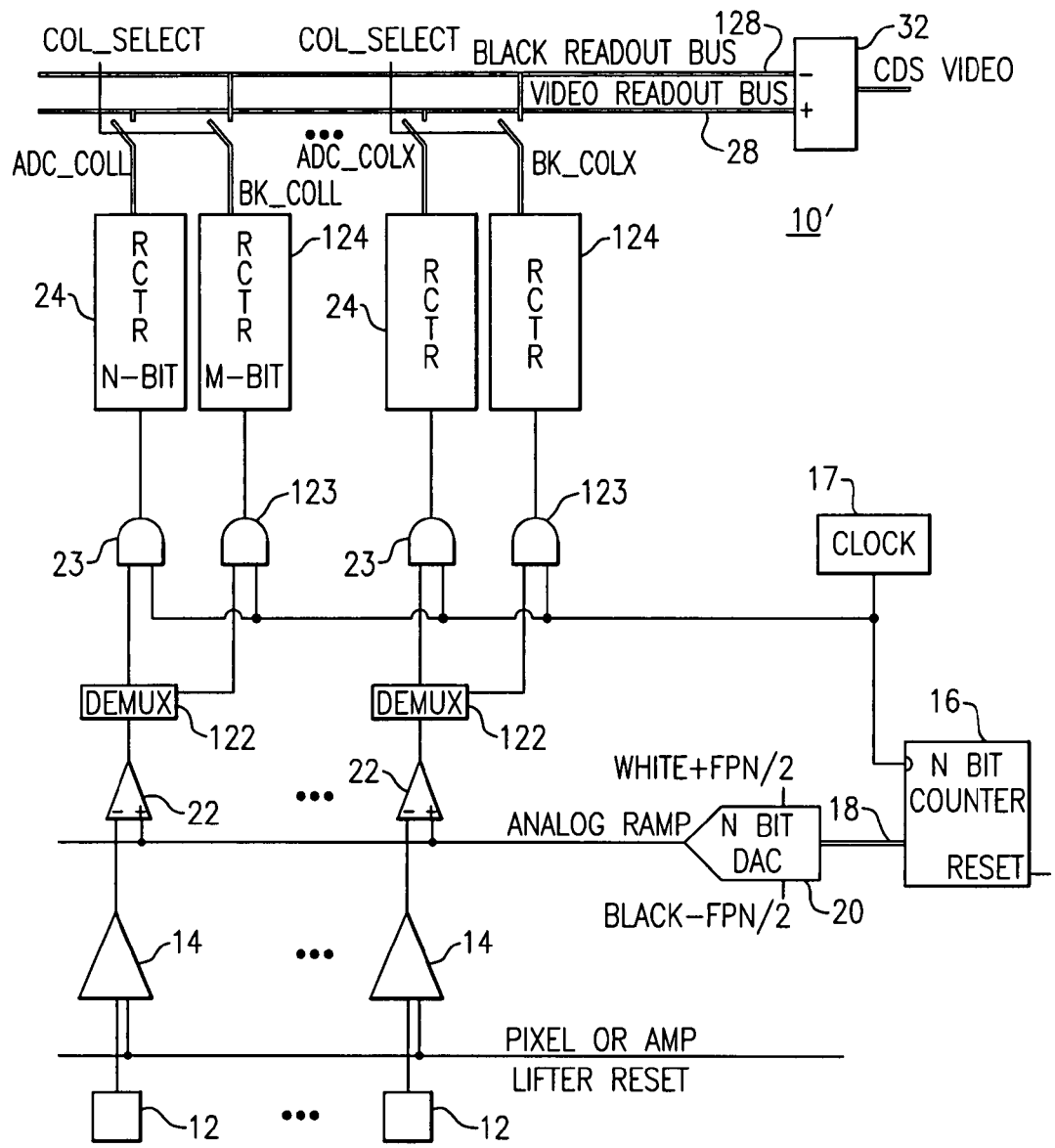
FIG. 3 is a schematic circuit diagram of another embodiment of this invention.

As shown in FIG. 3, an embodiment of the imager 10 is adapted for compensation for fixed pattern noise or FPN, and as with the previous embodiment employs an array of pixels 12, arranged in columns with associated pixel amplifiers 14, a clock pulse generator 17, an N-bit counter 16, a counter output bus 18, an N-bit DAC 20 which outputs an analog ramp, column comparators 22, logic gates 23, and video counter/latch elements 24, which perform as described in relation to the embodiment of FIG. 1. In addition, there is another set of counter/latch elements 124 and a second set of logic gates 123. The second counter/latch elements count and hold a value that corresponds to the contents of the N-bit counter 16 during reset. This value is a digital representation of the column pixel and pixel amplifier offset. To this end, there is a de-multiplexer 122 situated between the comparator 22 of each column and inputs of the logic gates 23 and 123, which supply clock pulses to the associated video counter/latch element 24, which is an N-bit latch, and to the associated offset counter/latch element 124, which may be a smaller, M-bit latch. The outputs of the counters/latches 24 are sequentially fed to the video readout bus 28, and those of the counters/latches 124 are fed to a black readout bus 128. These both lead to a digital subtraction element 32, which outputs an offset-corrected video or CDS digital video signal. Not shown for simplicity is the reset signal to latch/counter elements.

This embodiment, which employs this CDS scheme may be explained in the waveform diagrams of FIGS. 4A to 4G, where a 3 bit video digitizing (FIG. 4C) is followed by a 2 bit FPN digitizing. Sample-and-hold signal (FIG. 4A) and Readout_Clock signals (FIG. 4B) occur at the times shown, as described in connection with the first embodiment. The video outputs are subject to the clocked counter output COUNTER (FIG. 4E) and are gated on and off as indicated as digital values ADC_Col 1, ADC_Col2, and ADC_Col3. Once the video digitizing has completed, the pixels 12 (and/or pixel amplifiers 14 and/or latch/counters 24) are reset (FIG. 4D) to the black level+FPN (FIG. 4C) and those voltages compared with the AnalogRamp voltage, and are digitized into respective counter/latch elements 124, as indicated by digital values Blk_Col1, Blk_Col2, and Blk_Col3 (FIG. 4F). The ADC_Colx and Blk_Colx are read out simultaneously and fed to the digital subtraction element 32 to remove the black_level+ FPN from the video_signal+black_level+FPN and thus output only the pure video signal. Because only a reduced number of bits is needed in the black digitizing, very few clock cycles are added to the overall line time to achieve FPN reduction.

The CDS described is DS and not true CDS; true CDS requires the black level to be digitized before pixel exposure and stored until used for subtracting from the later digitized video signal. The digital latches, being noise free and consuming virtually no power, constitute excellent memory cells and provide a linear sensor method of resetting the pixels while digitizing and storing the black level. Then pixel exposure can be carried out, holding the amplifier output. The amplifier output is subsequently digitized and combined with the previously stored black values. This subtracts the black level and offset from each corresponding digitized video level, to yield a true CDS solution. In previous area sensors the black levels have had to be stored for the entire array and not just a line at a time. But here, since the black levels are already in digital form, true CDS can be implemented using a memory array for storing of only M-bits per pixel during pixel reset.

Figure 5:
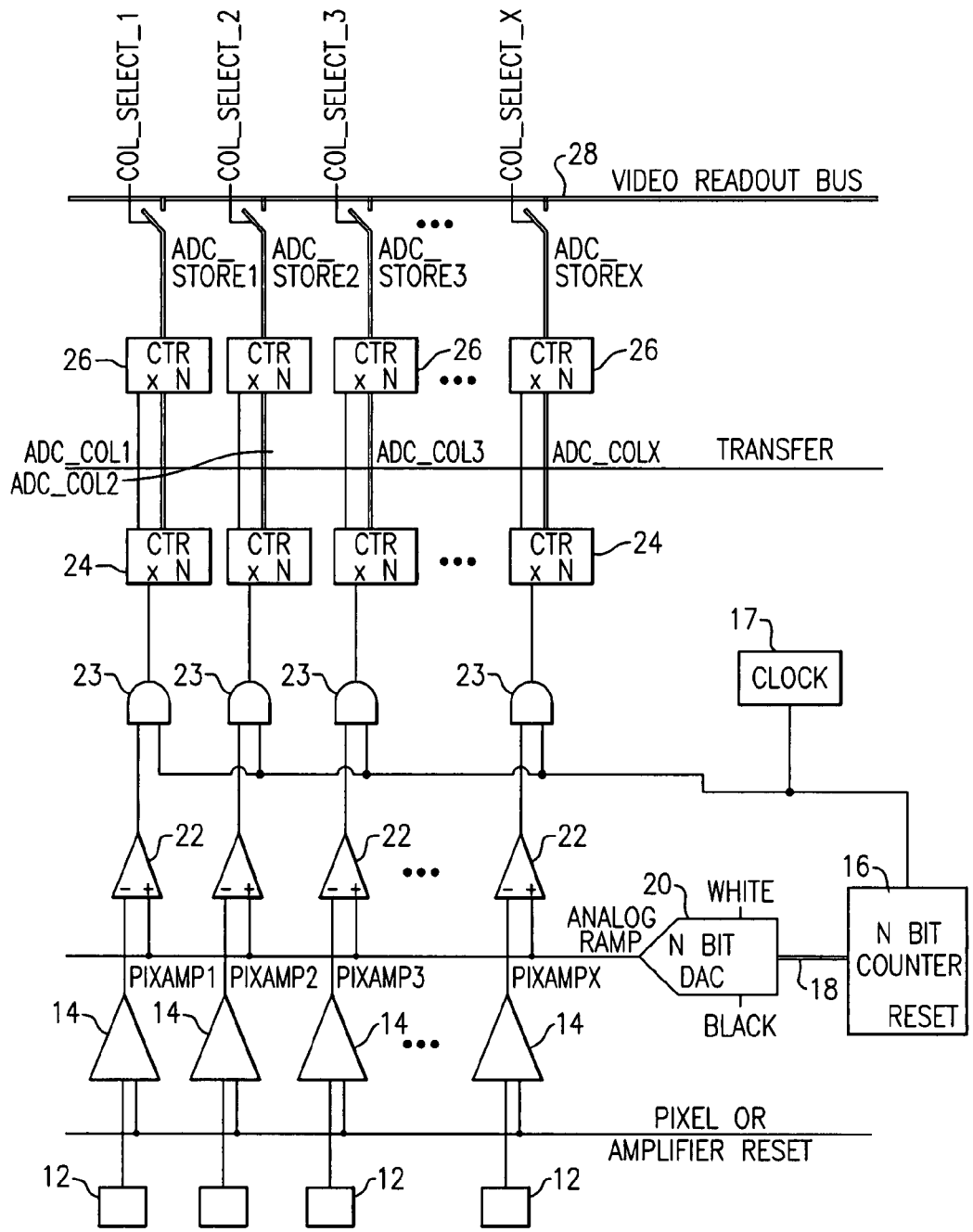
FIG. 5 is a schematic circuit diagram of another embodiment of this invention.

Another embodiment is illustrated in FIG. 5, in which a second layer of latching hides the conversion time of $2^N$ clock cycles. The same elements that are present here as in the previous embodiments are identified with the same reference numbers, and a description of those elements is omitted here. A set of second level counters/latches 26 is introduced here to pipeline the video level counters/latches 24 at the end of a conversion cycle. Here, the second counters/latches 26 are latched in response to a transfer update signal Transfer. In other words, the first layer digital video counters/latches 24 can convert the video levels during the above-described conversion time ($2^N$ clock cycles) simultaneously with the readout of converted video levels from the previous row or line is being readout, i.e., from the second level counters/latches 26. This enables the $2^N$ clock cycle conversion time to be hidden during readout and the line-overhead time (i.e. the time slot between reading out the last pixel in one row to the first pixel in the next) can be greatly minimized or even made negligible.

With this embodiment the Sample-and-Hold signal (FIG. 6A), Readout_Clock (FIG. 6B), PixelAmp1, -2, -3, and AnalogRamp signals (FIG. 6C), Counter and ADC_Col1, -2, and -3 (FIG. 6D) appear as in the FIG. 1 and FIG. 2 embodiment. After the first conversion line or field of video is converted, the transfer signal (Transfer—FIG. 6E) occurs to actuate the counters/latches 26 and transfer to the counters/latches 26 the contents of the video level counters/latches 24, which all contain the A/D converted digital levels corresponding to all the pixels 12 or column amplifiers 14. The second level counters/latches 26 are sequentially selected onto the video level bus 28 during the same time when the next video line or field is converted (FIG. 6C). That is, while the next row of pixels 12 or column amplifier 14 voltages are being converted, the previous line of digital values ADC_Store1, ADC_Store2, ADC_Store3 are transferred to Video_Bus (FIG. 6F).

If an N-bit DAC is used as a ramp generator it will be possible to run the associated counter in increments of $2^Y$ and get an ADC that converts in clock cycles. For instance if a 16-bit DAC is used as a ramp generator, 16-bit digitizing of every pixel in 64K clock cycles is done by counting in increments of 1. If the counter increments by $2^8$ (0, 256, 512 . . . ), 8-bit digitizing of every pixel in 256 clock cycles can be done with the same hardware. Counting by increments of $2^4$ (0, 16, 32 . . . ) will give get 12-bit digitizing in 4K clock cycles. This scheme makes one device flexible enough to digitize faster with low resolution and slower with high resolution.

Figure 13:
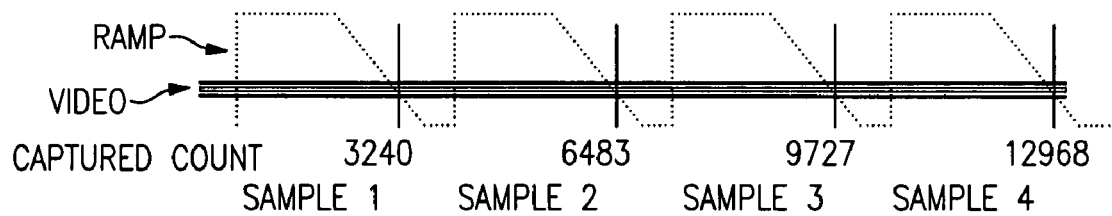
FIG. 13 is a signal diagram showing capture of the count over a number of samples.

FIG. 13 is a chart showing the overlay of the DAC ramp and the sampled video level signals, illustrated to show the effect of cumulative captured counts for successive sample periods of the same video value, i.e., oversampling. In this example, the same video value, i.e., pixel value is sampled four times. The ramp generated from the DAC 20, as previously described, generates a count in the counter/latch 24 each time the ramp crosses the level of the video signal which is here represented as the horizontal line. The counter/latch is not reset, but resumes each time to produce a cumulative count. As shown, at the first sample, this video level produces a count of 3240 for sample 1, and then at samples 2, 3, and 4, the cumulative count is 6483, 9727, and 12968. Here, the counter 24 is a fourteen-bit ripple counter, and by dropping the two least significant bit and employing only the top twelve bits, the value is read out directly as a count of 3242, i.e., in effect a divide-by-four operation. On the other hand, for extremely low light level operation, the cumulative total of the four samples can be read out by using the lower twelve bits, and disregarding the upper two.

Figure 7:
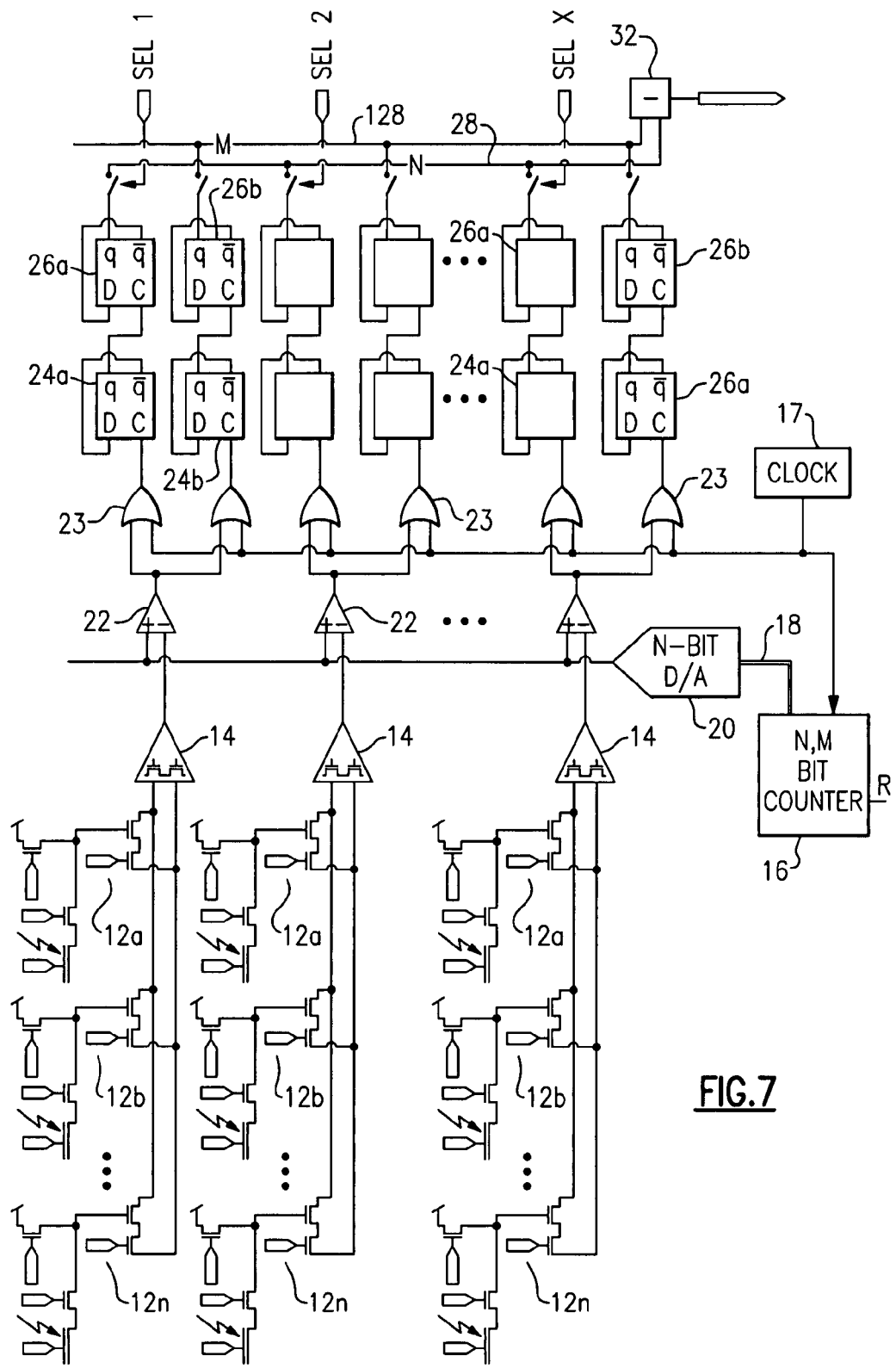
FIG. 7 is a circuit diagram of another embodiment.

FIG. 7 is a preferred embodiment of an area sensor, where features of both the FIG. 3 and FIG. 5 embodiments are incorporated. The elements that are in common with the previous embodiments are identified with the same reference numbers and a detailed description of those elements is omitted. There are both video level counter/latches 24a and black level counter/latches 24b as well as second-level counter/latches 26a and 26b, to pipeline the conversion stage and allow both temporal and offset compensation conversion while reading out the black and video levels from the previous row. The conversion time for this preferred embodiment is $2^N+2^M$ clock cycles, but this time is hidden behind the second level counter/latches and is simultaneous with the readout time. Here, for sake of simplicity, this view shows a single DFF to represent an entire set of flip-flops that would constitute the counter 24a, 24b, 26a or 26b. Here, in each column are pixels 12a, 12b, . . . 12n with the pixels being in different successive rows. The latch/counters 24a and 24b are capable of summing multiple samples in the same row, as well as summing up pixel values in different rows.

The counters 26a, 26b of FIG. 7 can be employed to sum up multiple samples of the same row or different rows. This is accomplished by keeping the counter value from a currently selected row, e.g., the row with pixels 12a, and selecting the next row, e.g., the row with pixels 12b, and then re-sampling.

Figure 8:
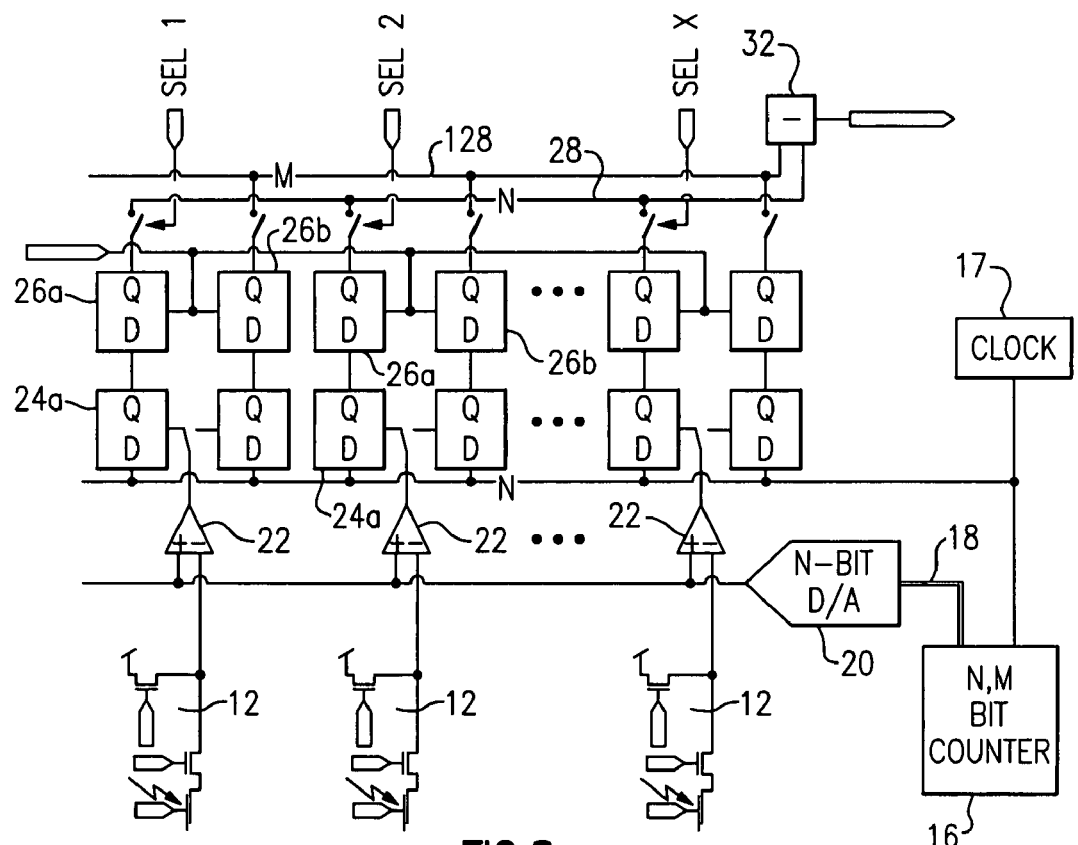
FIG. 8 is a diagram of an linear imager of this embodiment.

FIG. 8 is another embodiment, here shown for a linear sensor, where the sense nodes from selected rows of the pixels 12a to 12n are applied directly to the inputs of the comparators 22, i.e., the inputs are identical to the comparator input signals. This configuration reduces the amount of circuitry and power consumption. In this embodiment, the column amplifiers 14 are absent. The remaining elements are as identified in the previous embodiments.

Figure 9:
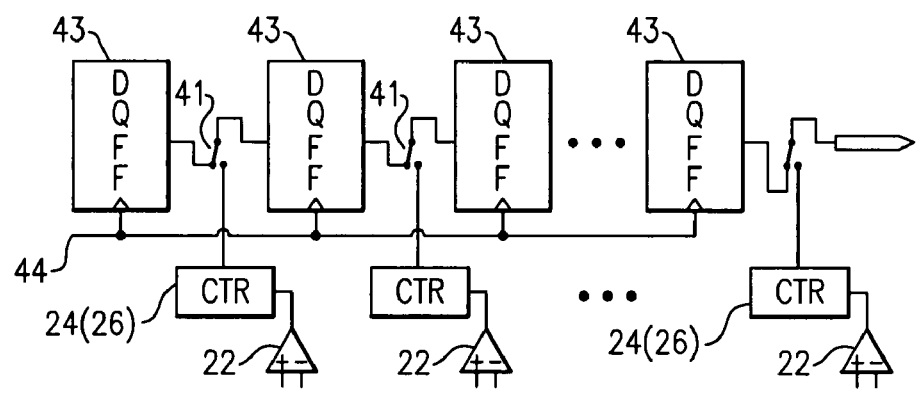
FIG. 9 is a diagram of another embodiment.

FIG. 9 is an alternative implementation of a digital readout structure, where sequential select signals are omitted and replaced by a column-wide-signal similar to the update signal Transfer controlling a selector switch 41. The black and/or video level ripple counter latches (both represented by a single counter/latch 42) are read into a set of DQ flip-flops 43, either static or dynamic, and the black/video levels are shifted from one DQFF 43 to the next using the readout clock signal 44. The advantage of this technique is that there are no wide digital busses to multiplex and thus the readout speed can thus be much higher.

Digital post-processing algorithms can be employed to achieve a higher bit resolution in some picture areas of interest and a lower resolution in the areas of less interest. This same benefit can be accomplished with the circuitry of this invention, where the counter is incrementing by one step at a time within some range of certain count values, the count increment is doubled in another range of count values, and increment is doubled again in some other range of count values, and so on. This gives the digitized values a resolution of for instance 16 bits near black, 15 bits at dark, 12 bits at gray and 8 bits at white with a resulting conversion time being much lower than 64K clock cycles. For high N and M values, the conversion time can become long. This time can be greatly reduced by reducing the resolution for portions of the image where high resolution is unimportant. The higher resolution areas can be in the gray areas, dark areas, or bright areas, depending upon the particular application.

Figure 9A:
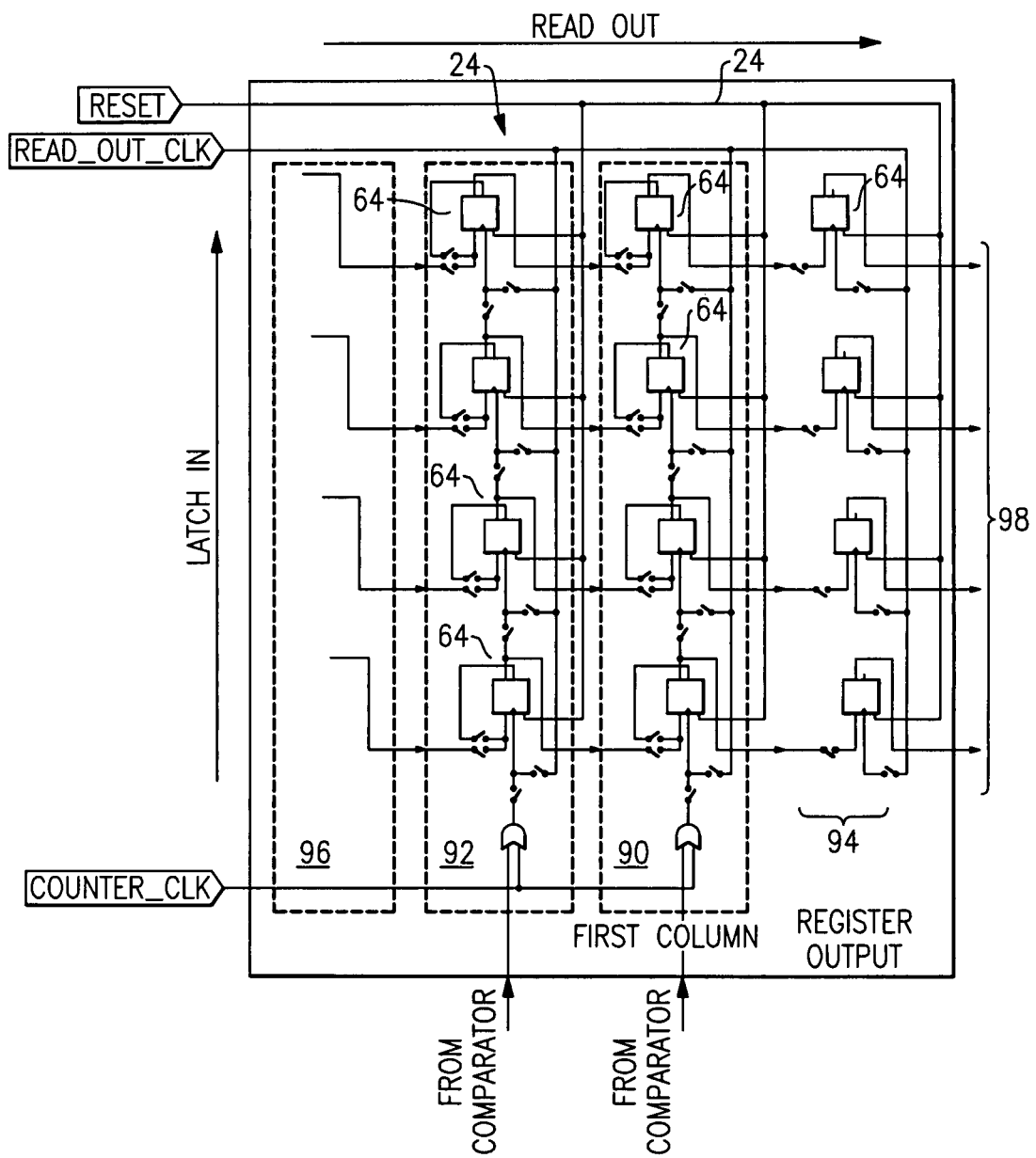
FIGS. 9A and 9B are schematic diagrams for explaining the operation of the counter/latch elements.
Figure 9B:
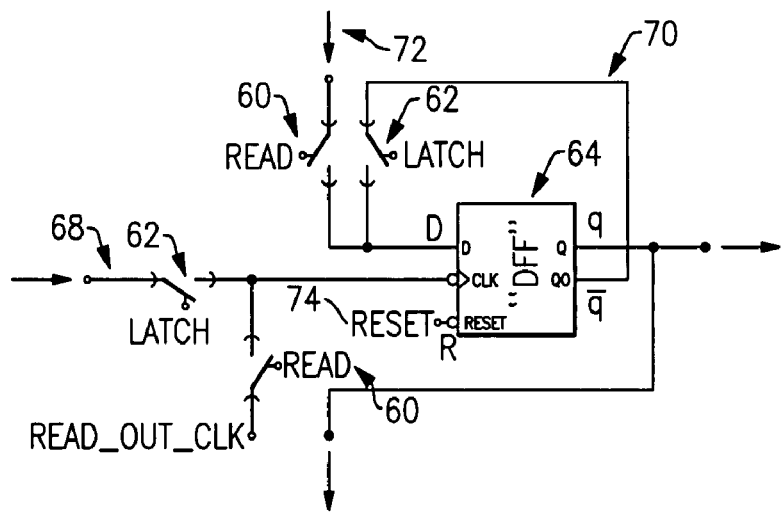

FIG. 9A illustrates the architecture for configuring a D flip-flop array as ripple counters 24 to be used during a pixel sampling phase and then reconfiguring them, electronically, as shift-registers to clock out the stored data in sequence. Reference is also made to FIG. 9B, showing detail of one DFF counter latch bit used as shift register, and to FIG. 9D, formed of FIGS. 9D-1 to 9D-9, for explaining timing of the counter/latch used initially as counter and then reconfigured as shift register.

In FIG. 9A, the D flip-flops 64 are connected to be used for binary counters, i.e., ripple counters. Here the counters 24 are shown as four-bit counters, for purposes of illustration, but in a practical embodiment these could have any desired number of bits. Here there are two column circuits shown, columns 90 and 92. The remaining columns, not shown, would be of similar construction. Also shown here is an optional set of extra latches 94, which may be included or omitted, depending upon application. All the counter/latches are formed of D-type flip flops, and have the same circuit loading. The number of bits employed in the counter, the counter configuration, and the control logic can be varied as desired, and the techniques and options for such would be available to persons skilled in this art. The counters 24 count clock pulses during the ramp period sample time. With further reference to FIG. 9B, the D flip flop 64, when used as a counter bit, has a feedback connection from the Q or Q-inverse output 70 to the D input, and an input clock node 68, that is, from the DAC counter clock or the previous bit Q output, as shown in FIGS. 9A and 9B. To be configured as a counter bit node as shown in FIG. 9B, nodes 68 and 70 have the Latch control signal 62 enabled to provide continuity, and have the Read signal 60 disabled. When the D flip-flop 64 is configured a shift register to clock out the latched count values, the Latch signal 62 is disabled and the Read signal 60 is enabled. This connects adjacent columns along each bit level.

As seen in FIG. 9B, the adjacent column bit on node 72, for example, latches in the count from column n−1 and feeds the registers of column n. Column n+1 in turn drives node 72 to column n+2 when used as a shift register. The D flip flops 64 are reset to begin a new cycle, or clear the latched values at the appropriate times, using the reset control node 74.

Figure 4:
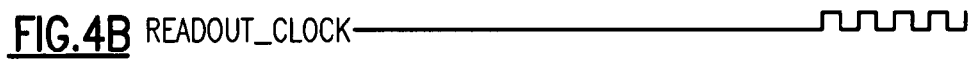
FIGS. 4A to 4G are signal charts for explaining the operation of this embodiment.
Figure 10:
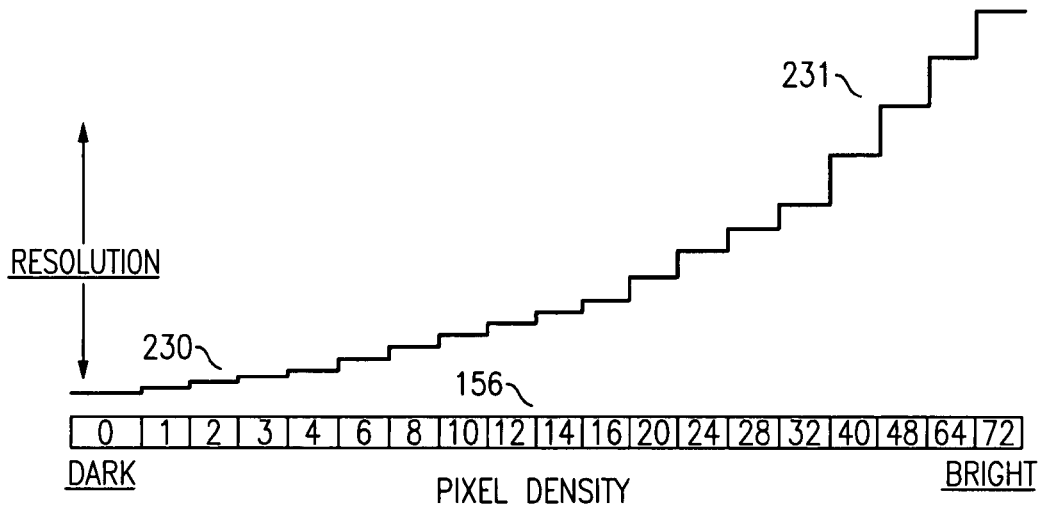

FIGS. 9C-1 to 9C-10 show the timing of the arrangement of FIG. 9A. The timing of the counter/latch circuit 24 is explained beginning at FIG. 9C-1 and 9C-2, which show timing of the comparator 22 outputs, indicating when the comparator outputs for the first and second columns change state. FIG. 9C-3 shows the latch control signal LATCH which changes state after the column counter/latch elements 90 and 92 have accumulated their count values. FIG. 9C-4 shows the clock pulse timing of the clock signal COUNTER_CLK, and FIGS. 9C-5 and 9C-6 show the accumulation of the counts in the column counter/latch elements 90 and 92. FIG. 9C-7 shows the timing of the read-out clock pulse signal READ_OUT_CLK; FIG. 9C-8 shows the timing of the read control signal READ; and FIG. 9C-9 shows the timing of the transfer of the pixel values of columns 90 and 92 when the counter/latch 24 is used as shift register. Finally, FIG. 9C-10 shows timing of the reset signal RESET.

In the example as shown here, the timing starts out by resetting the counter latches when the reset signal RESET goes low. To count up, the latch signal LATCH is high and the read signal READ is low. Then the column counter/latches count the DAC counter clock signal COUNTER_CLK and when the comparator signals go high (FIGS. 9C-2 and 9C-3), the count is captured for each column. The first column 90 latches a final count of 03 (hexadecimal) and the second column 92 latches a final count of A (hexadecimal). The counter/latches are reconfigured as shift registers by enabling the read control signal READ and disabling the latch control signal LATCH. The read clock signal READ_OUT_CLK then shift the counts of the columns 90 and 92 down the line to the output of the register output bus 98. First the value 03 is shifted, and the subsequent read clock pulse READ_OUT_CLK shifts the value A to the output bus 98.

FIG. 10 illustrates a technique for shortening the conversion time, in which the counter 16 can be made to count in incremented steps causing the bit resolution to be highest near black (e.g. 16-bits) and reduce as the pixel converted gets brighter (e.g. 10-bits). Conversion is linear, but the result is a digital video with intentional missing codes at brighter pixels. This embodiment is preferable in cases where the video is subjected to a subsequent gain stage (white balance, color convolution or other) or gamma lookup table (optional black-level sampling for CDS is not shown).

Figure 11:
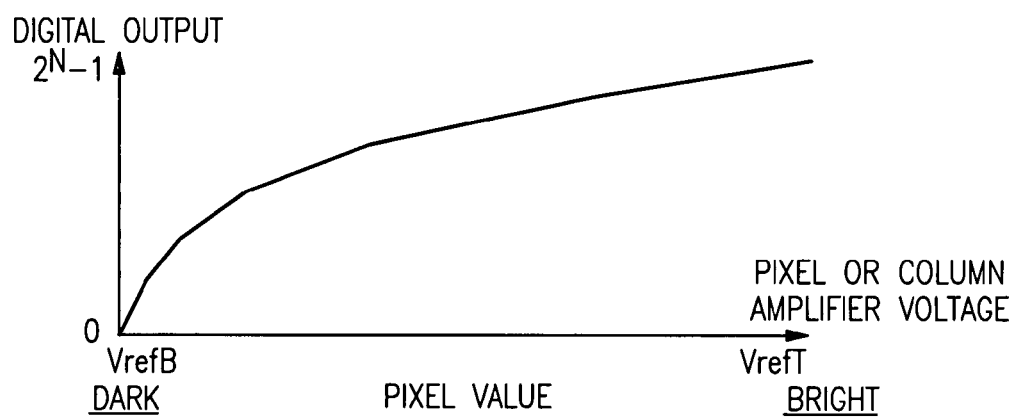

FIG. 11 illustrates another alternative technique and shows the output of the ADC per column when the DAC 20 has exponential voltage output while the counter 16 provides a linear count. The result is a digital video output that is gamma-corrected. Other embodiments with non-linear counter to DAC relationships are also possible in the present invention.

Figure 12:
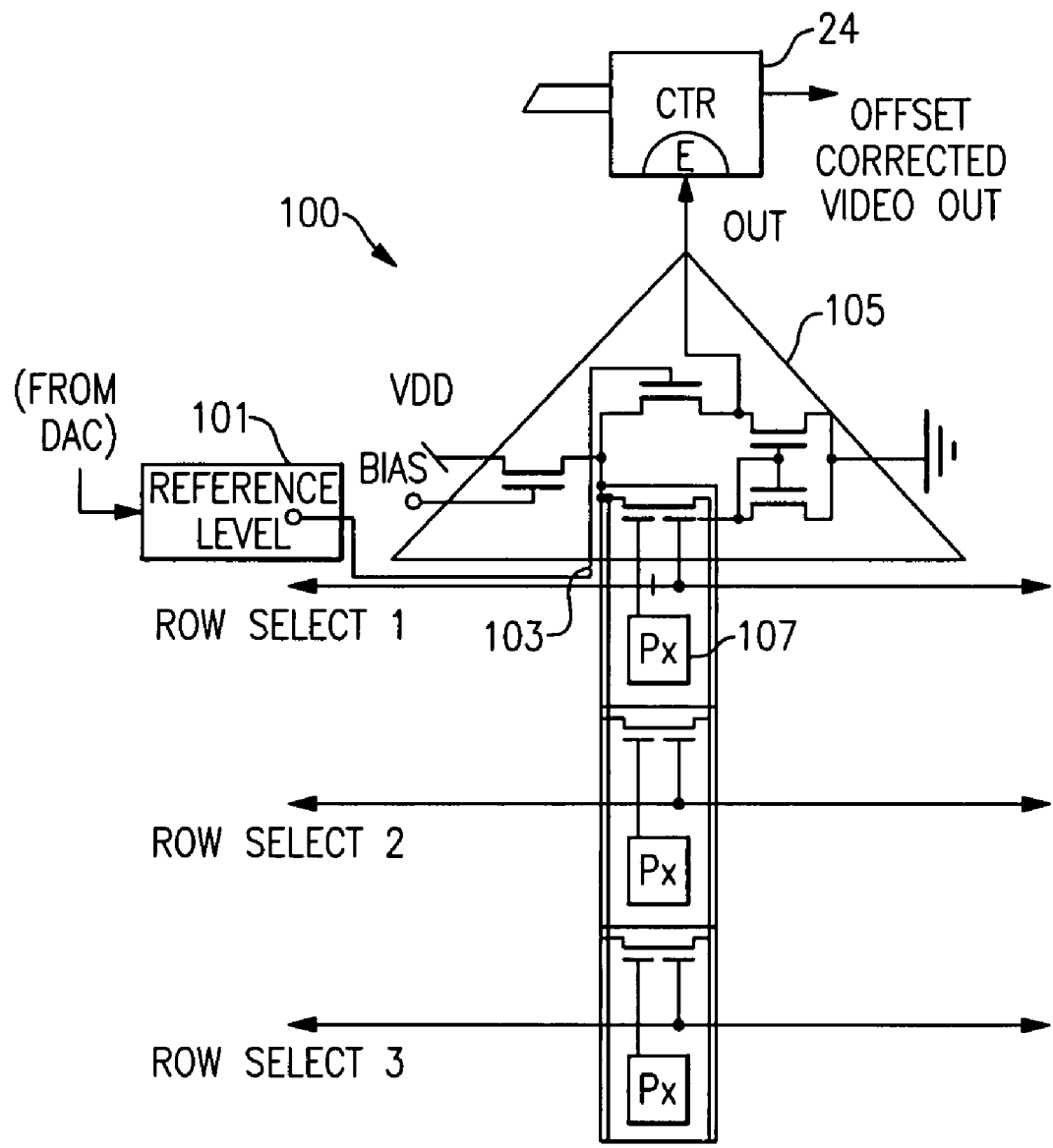
FIG. 12 illustrates an embodiment of this invention in which an active column sensor is reconfigured as comparator.

Referring to FIG. 12, another particular embodiment employs an active column sensor device 100 (as detailed in U.S. Pat. No. 6,084,229) which is reconfigured to serve as a comparator with respect to a reference level source 101. In this embodiment the feedback path for the active column sensor (e.g., as explained in respect to FIG. 2 of U.S. Pat. No. 6,084,229) is removed and the reference signal or reference level source 101 is coupled to one of the inputs 103 of an associated operational amplifier 105. The output of the operational amplifier 105 controls the associated latch/counter 24. The remainder of the active column sensor 100, such as the internal components and operation of the amplifier 105 and the pixels 107, by way of example only, are the same as described in U.S. Pat. No. 6,084,229, which is incorporated herein by reference and need not be described here. When an input or collected signal is received from the pixel 107, the active column sensor is reconfigured to be compared to a reference signal provided by the reference level source 101. The difference between the two input signals is amplified by the open loop gain of the amplifier 105, causing the output to slew to the most positive or most negative limits of the amplifier 105. A comparator is often used as the first stage in some analog-to-digital converter architectures. Although in the particular embodiment the output reconfiguration circuit is a reference level source 101, other types of output reconfiguration circuits may also be used, such as an integrator circuit or circuit with gain, by way of example only. The ramp AnalogRamp from the DAC 20 would serve as the reference level for the reference level source 101.

With many types of digital post-processing algorithms (e.g. digital gain and gamma correction) it is advantageous to have a higher bit resolution near black and lower bit resolution near white. This can be accomplished with the same hardware as described in the previous paragraph where the counter is incrementing by 1 up to a certain count value where the count increment is doubled until a next count where the increment is doubled again and so on. This makes the digitized values have a resolution of for instance 16-bits near black, 15-bits at dark, 12-bits at gray and 8-bits at white with a resulting conversion time being much lower than 64K clock cycles.

Other ways to speed up read-out can employ multiple parallel video busses: One implementation could use one digital video bus for all odd pixels and one for all even pixels. Another could use one bus for pixels 1 to y, one for y+1 to 2*y, and so on. Then, the digital values can be multiplexed onto one single video stream just before sending it off chip.

A significant advantage of a working with the video signals in digital form is that the busses can be separated by a latch or flip/flop to pipeline the video signal and thus decrease the readout time to the time it takes to charge only one level of the bus.

Figure 14:
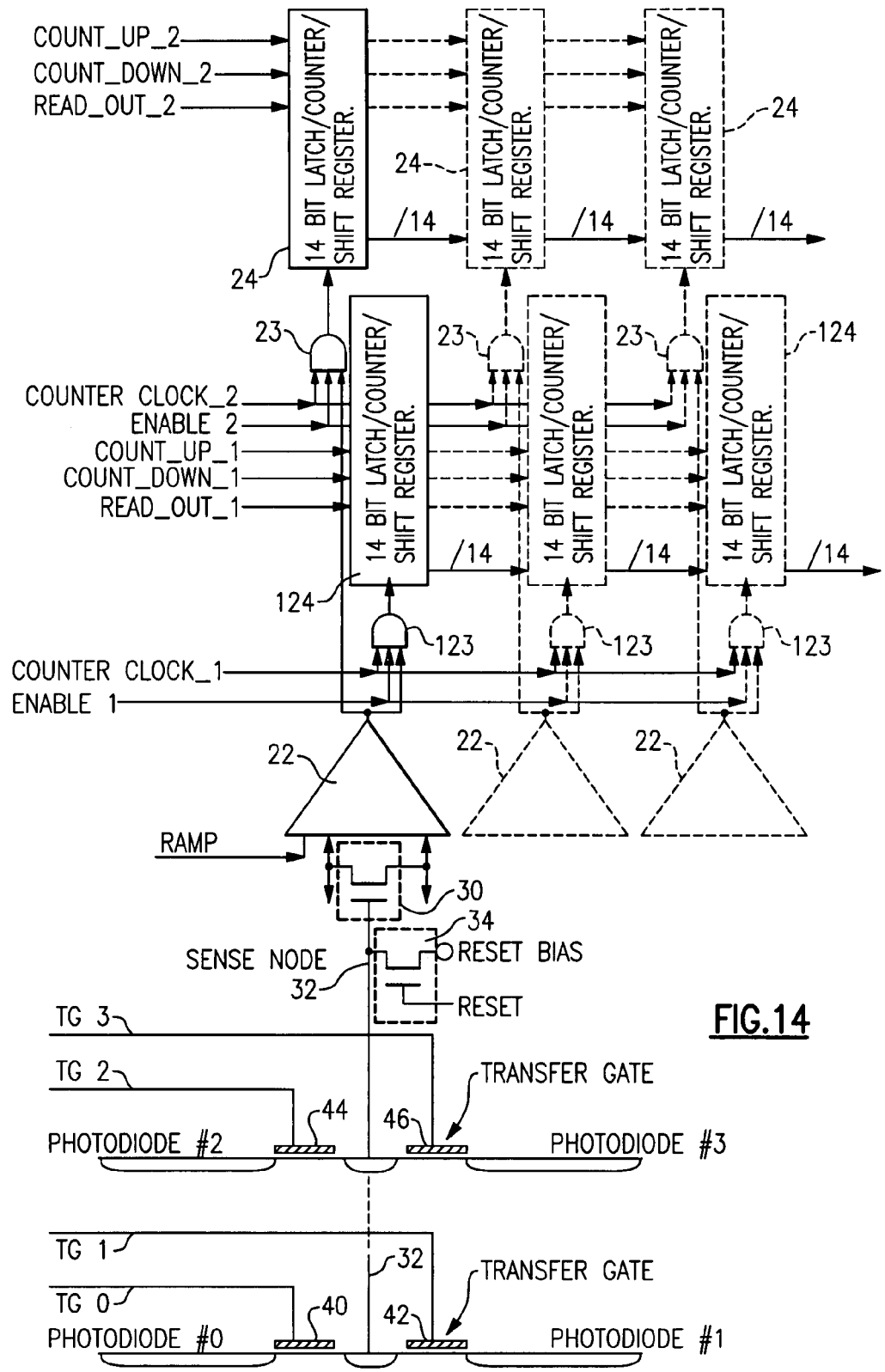
FIG. 14 is a schematic circuit diagram of an imager wherein four pixels shared a sense node, without selection transistors.

FIG. 14 illustrates an embodiment of this invention in which multiple pixels are associated with a single pixel transistor, with the multiple pixels sharing the pixel output transistor, in the fashion generally shown in U.S. Pat. No. 7,057,150, but here incorporating the distributed A/D converter arrangement of this invention. This embodiment will be discussed for an explanation of oversampling for the purposes of removing temporal noise and also for dynamic range enhancement.

The imager arrangement of FIG. 14 has a series of column amplifier/comparators 22, each of which is connected, in turn, with the pixel amplifier FETs 30 of that column, and which also receives the output ramp signal Ramp from the N-Bit DAC 20, as previously discussed. Each of the column amplifier/comparators 22 feeds a pair of logic gates 23 and 123, and these in turn provide output pulses to associated 14-bit latch/counters 24 and 124, so that there are two parallel rows of output buses formed by these latch/counters 24, 124. The logic gates 23 and 123 also have inputs that are respectively applied with signals Enable 1, Counter Clock 1 and Enable 2, Counter Clock 2.

As in the multiple pixel arrangement of the aforementioned U.S. Pat. No. 7,057,150, for each pixel there is a sense node 32, a reset transistor 34, and four photodiodes, here designated Photodiode #0 through Photodiode #3. There are transfer gates 40, 42, 44 and 46 for these photodiodes, respectively, to gate each one to the associated sense node 32.

The latch counters 24, 124 may be implemented with D-type flip flops, configured as ripple counters and then as latches, which allows the output bus to occupy a smaller amount of the silicon, and permits the imager to have a smaller die size.

With reference in addition to FIGS. 15A to 15M, the oversampling operation conducted with the imager of FIG. 14 will be discussed. Oversampling is conducted in this manner:

After a desired integration time a reset signal Reset (FIG. 15A) is turned on (high) to reset the sense node 32. In this example, the reset bias is driven to 2.6 volts. The ramp signal Ramp (FIG. 15F), Count Down 1 (FIG. 15L), Enable 1 (FIG. 15H), and Counter Clock 1 (FIG. 15I) are applied to the latch/counters 24, and the ramp signal Ramp (FIG. 15F) is generated. These are synchronous with one another so as to generate a linear response, but non-linear response, if desired, could be generated, as discussed previously, such as a Gamma or another appropriate video processing function.

When the ramp signal Ramp value matches the pixel reset bias, i.e., background level, the counter 24 stops counting and latches the value. These steps are repeated as many times as desired for oversampling the background level.

Then, the voltage level is transferred from one or more of the photodiodes onto the sense node 32. In this example, it is the Photodiode #3 that is sampled, and a gating signal TG3 (FIG. 15B) appears on the transfer gate 46. Then, the signals Ramp, Up Count 1 (FIG. 15M), and Counter Clock 1 (FIG. 15I) are applied to the latch/counters 24. The signals Counter Clock 1 and Ramp are synchronous with one another, and generate the desired linear or non-linear response. When the value of Ramp matches the pixel value, i.e., video level, the counter stops counting, and latches at that value. These two steps are then repeated as many times as desired for oversampling the video level. The pixel can be reset to initialize integration and minimize lag by issuing signals Reset and TG3 at the same time.

The signals Read Out 1 (FIG. 15J) and Read Clock 1 (FIG. 15L) are enabled to read out the latched values. If, as shown here, there are two sets of latches 24 and 124, then while the first pixel in sequence is being read out, the pixels in the next row can be oversampled in the same fashion and latched onto the other array of counters/latches, applying the second enable signal Enable 2 (FIG. 15H).

In this example, only one photo diode, Photodiode #3, has been sampled. However, it is possible to sample another diode, or several of the photodiodes, by applying the other gating signals TG2 (FIG. 15C), TG1 (FIG. 15D), and/or TG0 (FIG. 15E).

With reference to the circuit of FIG. 14 and the waveforms of FIGS. 16A to 16M, binning can be accomplished by selecting a sense note, resetting it to background level, sampling the background, transferring and sampling the desired pixel and then repeating the same process on the other pixel or pixels that are to be binned together. Timing of the binning pixels can be the same or different, depending on the pixel technology used.

Binning can be accomplished in the following manner for the standard photodiodes Photodiode #0 to Photodiode #3 that will share the photon generated charge with the same sense node 32. After a desired integration time, the reset signal Reset (FIG. 16A) is turned on (high) to reset the sense node 32, which in this example is at 2.6 volts. The ramp signal Ramp (FIG. 16F), and the signals Down Count 1 (FIG. 16L), Enable 1 (FIG. 16H), and Counter Clock 1 (FIG. 16I) are applied via the logic gates 23 to the counter/latches 24. The Counter Clock 1 and Ramp signals are synchronous with each other to generate a desired linear or non-linear response, as discussed previously. When the value of the ramp signal Ramp matches the level of the pixel reset bias, that is, the background level, the counter 24 stops counting and latches that value.

Then, one or more pixels, i.e., one or more of the photo diodes Photodiode #0 to Photodiode #3, are gated using gating signals TG0 to TG3 (FIGS. 16B to 16E). In this example the gate signal TG3 is applied to transfer gate 46, and the photon generated charge is transferred from Photodiode #3 to the node 32. Now the ramp signal Ramp and signals Up Count 1 (FIG. 16M) and Counter Clock 1 (FIG. 16D are applied via the logic gate 24 to the latch/counter 24. The signals Counter Clock 1 and Ramp are synchronous with each other, and generate a linear or an appropriate non-linear response as desired for the appropriate video processing function.

When the ramp value of the signal Ramp matches the pixel value, i.e., the video level, the latch/counter 24 stops its count and latches that value. These steps are repeated for the number of pixels to be binned together, and this is shown as repetition of gating signal TG 1 (FIG. 16D). The pixels i.e. the Photodiodes #0 to #3 can be reset, i.e., shown as repeated occurrences of Reset in FIG. 16A, concurrently with occurrences of the gating signal(s) TG 3 (FIG. 16B). The pixels are reset this way to initialize integration and to minimize lag.

Then, the signals Read Out 1 (FIG. 16K) and Read Clock 1 (FIG. 16K) are enabled, and these are operative to read out the latched values of the counters/latches 24. The second set of latches/counters/shift registers 124 allow a next pixel in the desired sequence to start binning while a previously sampled and binned rows are being read out of the array of latches/counters 24.

When using Up/Down counters, as shown, the video level will have the background level already subtracted from it. If multiple latches are used, the background samples and/or video samples will have to be subtracted or added in a separate circuit element. Binning using the method just described combines two or more pixels on a chip without any of the noise advantages of oversampling, and with two or more standard photodiodes that can only share their charge with the sense node 32.

The process of binning from the two or pixels from binned photodiodes or photogates can be explained with reference to the diagram of FIG. 14 and with further reference to the waveform diagrams of FIGS. 17A to 17M.

Here binning is accomplished by selecting a given sense node 32, resetting it to background level, sampling the background, transferring and sampling the desired pixel and repeating the same process on the other pixel or pixels that it is desired to bin together. Timing for binning the pixels can be the same or different, depending on the pixel technology used. For photogates and pinned photodiodes that transfer the charge onto the sense node 32, rather than share charge with the sense node, binning can be accomplished at the same time if the pixels share the same sense node, as in the configuration of the type shown in U.S. Pat. No. 7,057,150. This arrangement has the benefit that less time is required, as only one sampling is needed. This also results in less noise in the resulting video.

Binning is accomplished in the following manner using the standard photodiodes that share the photon-generated charge with the sense node 32.

After the desired integration time, the reset signal Reset (FIG. 17A) is turned on (high) to reset the sense node 32. In this example, the reset bias is driven to 2.6 volts. The signals Ramp (FIG. 17F), Down Count 1 (FIG. 17M), Enable 1 (FIG. 17H), and Counter Clock 1 (FIG. 17I) are applied through the logic gate 23 to the flip flops of the latch/counters 24. The signals Ramp and Counter Clock 1 are synchronous with one another, and generate a linear or non-linear response, as discussed earlier. When the ramp value of the signal Ramp matches the pixel bias level, i.e., the reset bias, the latch/counter 24 stops counting and latches the value. One or more pixels, e.g., Photodiode #1 and Photodiode #3, are transferred onto the sense node, by application of gate signals TG 1 (FIG. 17D) and TG 3 (FIG. 17B) to the respective transfer gates. Then the ramp signal Ramp, together with signals Up Count 1 (FIG. 17M) and Counter Clock 1 (FIG. 17I) are applied via the logic gate 23 to the latch/counter 24. The signals Ramp and Counter Clock 1 are synchronous with each other, and generate the appropriate linear or non-linear response. When the ramp value of the signal Ramp matches the pixel value, i.e., the video level, the latch/counter 24 stops counting, and latches the value.

The pixel(s) can be reset to initialize integration and minimize lag by issuing the reset signal Reset (FIG. 17A) and the gating signal TG 3 at the same time, and likewise for the signals Reset and TG 1.

The signals Read Out 1 (FIG. 17J) and Read Clock 1 (FIG. 17K) are enabled as shown to read out the latched values stored in the array of latch/counters 24. Where as second set of latch/counters 124 is provided, as shown here in FIG. 14, then the next pixel or pixels in sequence can be captured and can undergo the above-described binning process while the sampled and binned row(s) are being read out, using a similar sequence of steps. For this, the signal Enable 1 (FIG. 17H) would go low and the signal Enable 2 (FIG. 17G) would go high.

When using the Up/Down counters in this fashion the video level will have the background level subtracted from it, and thus be free of any pixel to pixel bias variation. If multiple latches are employed, then the background level(s) and video sample(s) will have to be combined or subtracted in a separate circuit stage. Binning by the above-described method combines two or more pixels together on a chip, without the noise reduction advantages of oversampling, if there are two or more photodiodes that can only share their charge with the sense node 32.

Dynamic range enhancement is explained with reference to the diagram of FIG. 14 and the waveform diagrams of FIGS. 18A to 18M. Dynamic range enhancement can be accomplished by selecting a given sense node, resetting it to background level, sampling background, transferring and sampling the desired pixel and repeating the same process on another pixel or pixels at a different integration time. For photogates and pinned photodiodes such as photodiodes #0 to #3, which transfer charge onto the sense node 32 rather than share charge with the sense node, binning can be accomplished at one time, i.e., using the configuration of U.S. Pat. No. 7,057,150. This has the benefit of higher speed, as the time for only one sampling is needed, and in addition there is less noise in the resulting video.

Binning can be accomplished in the following manner for the standard photodiodes #0 to #3, which share the photon generated charge with the sense node 32.

After the desired integration time, the reset signal Reset (FIG. 18A) is turned on (high) to reset sense node 32, e.g., driving the reset bias to 2.6 volts. The ramp signal Ramp (FIG. 18F) and the signals Count Down 1 (FIG. 18L), Enable 1 (FIG. 18H), and Counter Clock 1 (FIG. 18I) are supplied through the logic gate 23 to the latch/counter 24. The signals Ramp and Counter Clock 1 are synchronous with each other to generate a linear or non-linear response. When the value of the ramp signal Ramp matches the value of the pixel reset bias, i.e., the background level, the latch/counter 24 stops counting and latches this count as the background value. One or more pixels, e.g., from photodiode #1 and photodiode #3, are transferred to the sense node 32 by applying the transfer gate signals TG 1 (FIG. 18D) and TG 3 (FIG. 18B) to transfer gates 42 and 46. Then the ramp signal Ramp and the signals Count Up 1 (FIG. 18M) and Counter Clock 1 (FIG. 18I) are applied via the logic gate 23 to the latch/counter 24 to commence accumulating a count. The signals Ramp and Counter Clock 1 are synchronous with one another to generate a linear or non-linear response, as appropriate. When the value of the ramp signal Ramp matches the pixel value or video level, the latch/counter stops counting and latches the value. The pixel (s) can be reset to initialize integration and minimize lag by issuing the signals Reset and TG 3 at the same time, and likewise issuing the signals Reset and TG 1 simultaneously. The signals Read Out 1 (FIG. 18J) and Read Clock 1 (FIG. 18K) are enabled to read out the latched values from the counter/latches 24. When a second set of latch/counters 124 is present, the next pixel in sequence can commence the binning and accumulating sequence during the time the previously sampled and binned row is being read out, using the same technique as for the first row.

When using Up/Down counters, as shown, the video level will have the background level subtracted out from it. Where multiple latches are employed, the background sample(s) and video sample(s) can be subtracted or added on a separate circuit array.

When the two pixels, i.e., Photodiode #1 and Photodiode #3 have different integration times, then in the bright areas, one photodiode may be saturated, and the other not, or in shadow areas one may be moderately filled with photo-generated charge, but the other only weakly filled. Binning in this fashion provides detail in the dark and bright regions of the image, as well as in the areas of moderate exposure.

Oversampling with dynamic range enhancement can be accomplished by repeating the ramps Ramp for each sampling, as discussed above in respect to FIGS. 18A to 18M. Dynamic range enhancement with oversampling for pinned photodiodes and photogates is explained below, with reference to the diagram of FIG. 14 and the waveform diagrams of FIGS. 19A to 19M. Dynamic range enhancement can be accomplished by selecting a given sense node, resetting it to background level, sampling background the number of times desired, transferring and sampling the desired pixels and repeating the same samplings on the pixels. The pixels may have different integration times. The oversampling provides for reduction of noise in the resulting video.

Binning can be accomplished in the following manner for the standard photodiodes #0 to #3, which share the photon generated charge with the sense node 32.

After the desired integration time, the reset signal Reset (FIG. 19A) is turned on (high) to reset sense node 32, e.g., driving the reset bias to 2.6 volts. The ramp signal Ramp (FIG. 19F) and the signals Count Down 1 (FIG. 19L), Enable 1 (FIG. 19H), and Counter Clock 1 (FIG. 19D are supplied through the logic gate 23 to the latch/counter 24. The signals Ramp and Counter Clock 1 are synchronous with each other to generate a linear or non-linear response. When the value of the ramp signal Ramp matches the value of the pixel reset bias, i.e., the background level, the latch/counter 24 stops counting and latches this count as the background value. These steps (supplying Ramp, Count Down 1, Enable 1, and Counter Clock 1, and counting until the ramp level equals the background level) are repeated up until a desired number N of times. For example, there may be one oversampling, i.e., one additional repetition (total of N=2).

Two or more pixels, e.g., from photodiode #1 and photodiode #3, are transferred to the sense node 32 by applying the transfer gate signals TG 1 (FIG. 19D) and TG 3 (FIG. 19B) to transfer gates 42 and 46. Then the ramp signal Ramp and the signals Count Up 1 (FIG. 19M) and Counter Clock 1 (FIG. 19I) are applied via the logic gate 23 to the latch/counter 24 to commence accumulating a count. The signals Ramp and Counter Clock 1 are synchronous with one another to generate a linear or non-linear response, as appropriate. When the value of the ramp signal Ramp matches the pixel value or video level, the latch/counter stops counting and latches the value. These steps of applying Ramp, Count Up 1, and Counter Clock 1, and latching the latch/counters when the ramp value and the pixel level are equal are repeated to a total of N time (in this example N=2).

The pixel(s) can be reset to initialize integration and minimize lag by issuing the signals Reset and TG 3 at the same time, and likewise issuing the signals Reset and TG 1 simultaneously. The signals Read Out 1 (FIG. 19J) and Read Clock 1 (FIG. 19K) are enabled to read out the latched values from the counter/latches 24. When a second set of latch/counters 124 is present, the next pixel in sequence can commence the binning and accumulating sequence during the time the previously sampled and binned row is being read out, using the same technique as for the first row. (For a number of sample N=2, the least significant digit of the latch/counters 24, 124 may be dropped, i.e., divide-by-two).

When using Up/Down counters, as shown, the video level will have the background level subtracted out from it. Where multiple latches are employed, the background sample(s) and video sample(s) can be subtracted or added on a separate circuit array. Oversampling with dynamic range enhancement by the method just described combines two or more pixels together on chip, with the noise advantages of oversampling, and also with the advantages of enhanced detail visibility in both the bright and dark picture areas.

Thus, in view of the foregoing examples, the technique of this invention facilitates binning of the two or more pixels, e.g., Photodiode #1 and/or Photodiode #2, #3, and/or #0, with the same or different integration times, to achieve improved signal to noise, enhanced dynamic range, or both. That is, the binning can be carried out by selection of two or more pixels sharing the same sense node 32, with separate photodiode samplings; selection of two or more pixels on the same sense node with pinned photodiodes and photogates, using one sampling each for background and pixel data or selection of two or more pixels on different sense nodes combined onto the same readout. Oversampling can be carried out by selection of a given sense node sampling, and then resampling the pixels at that sense node, this being carried out directly and without use of a sample-and-hold circuit. Dynamic range enhancement is carried out with two or more pixels having different integration periods, on the same column readout. Dynamic range enhancement can also be carried out with two or more pixels, having different integration periods, with the two pixels being under the same microlense (see co-pending U.S. patent application Ser. No. 11/589,357—Pub. No. US 2007/0040100).

In any of the foregoing embodiments a preload count may be loaded onto some or all of the latch/counters. The preload is effectively an offset to be applied to the resulting digital video value. Then the actual digitized value is the sum of the preload count, minus the background or black-level value, plus the sampled video value. The offset or preload may be a positive or negative value. Also, the steps of loading the preload count onto the latch/counter, taking the black level or background count, and taking the video level count, can be carried out in a different order, if desired.

While this invention has been described in connection with selected preferred embodiments, it should be apparent that the invention is not limited only to those embodiments, but that many variations and equivalents would present themselves to those skilled in the art, and would not depart from the scope and spirit of this invention, as defined in the appended claims.

We claim:

1. Method of converting analog pixel values from an array of pixels to a digital video signal, said array comprising a plurality of columns and at least one row, each column having at least one pixel therein, and each column providing a respective pixel value; the method comprising providing a series of counts to a digital to analog converter (DAC) to generate a corresponding ramp output signal;

providing clock signals to a plurality of digital counter/latch/shift register elements each associated with a respective one of said columns;

for each of said columns, comparing the respective column pixel value with said ramp output signal, and gating the respective digital counter/latch/shift register element based on the comparison thereof;

transferring contents of said digital counter/latch/shift register elements to a video output to produce the digital video signal; and resetting the at least one pixel to produce a black level offset value, the digital counter/latch/shift register element first counting in a first direction a predetermined plurality of times to reach an oversampled black level offset value, then generating a charge on the at least one pixel for a given integration time, to provide a corresponding pixel video level for said column, and the digital counter/latch/shift register element counting in a second direction for said predetermined number of times to generate an oversampled video value that is compensated for the black level offset of said column.

2. The method of claim 1, further comprising preloading a predetermined count onto said digital counter/latch/shift register elements.

3. The method of claim 2, wherein different predetermined counts are associated with different respective pixels.

4. Method of converting analog pixel values from an array of pixels to a digital video signal, said array comprising a plurality of columns and at least one row, each column having at least one pixel therein, and each column providing a respective pixel value; the method comprising providing a series of counts to a digital to analog converter (DAC) to generate a corresponding ramp output signal;

providing clock signals to a plurality of digital counter/latch/shift register elements each associated with a respective one of said columns;

for each of said columns, comparing the respective column pixel value with said ramp output signal, and gating the respective digital counter/latch/shift register element based on the comparison thereof; and transferring contents of said digital counter/latch/shift register elements to a video output to produce the digital video signal;

and in which a black level offset value is accumulated on a plurality of black level readout counter/latch/shift register elements, each associated with a respective one of said columns; and the contents of the respective black level counter/latch/shift register elements are transferred simultaneously with the transfer of the contents of the associated digital counter/latch/shift register elements; and the values of the video level and the black level are combined with one another, to compensate for noise in the digital video signal.

5. The method of claim 4 wherein said black level offset value is counted onto said black level readout counter/latch/shift register elements for a predetermined plurality of repetitions, and said video level is likewise counted onto said digital counter/latch/shift register elements for said predetermined plurality of repetitions.

6. The method of claim 4, further comprising preloading a predetermined count onto said digital counter/latch/shift register elements.

7. The method of claim 6, wherein different predetermined counts are associated with different respective pixels.

8. Method of converting analog pixel values from an array of pixels to a digital video signal, said array comprising a plurality of columns and at least one row, each column having at least one pixel therein, and each column providing a respective pixel value; the method comprising providing a series of counts to a digital to analog converter (DAC) to generate a corresponding ramp output signal;

providing clock signals to a plurality of digital counter/latch/shift register elements each associated with a respective one of said columns;

for each of said columns, comparing the respective column pixel value with said ramp output signal, and gating the respective digital counter/latch/shift register element based on the comparison thereof; and transferring contents of said digital counter/latch/shift register elements to a video output to produce the digital video signal;

wherein each said column has two or more pixels that can be gated to a sense node for said column, and the method includes providing said clock signal to a plurality of digital counter/latch/shift register elements each associated with a respective one of said columns; gating a first of said pixels; comparing the respective value of the first pixel value with said ramp output signal; accumulating a count on said digital counter/latch/shift register element based on the comparison thereof; then gating another of said pixels; comparing the respective value of the second pixel with said ramp output signal; and accumulating the count on said digital counter/latch/shift register element based on the comparison thereof.

9. The method of claim 8 further comprising preloading a predetermined count onto said digital counter/latch/shift register elements.

10. The method of claim 9 herein different predetermined counts are associated with different respective pixels.

11. Method of converting analog pixel values from an array of pixels to a digital video signal, said array comprising a plurality of columns and at least one row, each column having at least one pixel therein, and each column providing a respective pixel value; the method comprising providing a series of counts to a digital to analog converter (DAC) to generate a corresponding ramp output signal;

providing clock signals to a plurality of digital counter/latch/shift register elements each associated with a respective one of said columns;

for each of said columns, comparing the respective column pixel value with said ramp output signal, and gating the respective digital counter/latch/shift register element based on the comparison thereof; and transferring contents of said digital counter/latch/shift register elements to a video output to produce the digital video signal;

wherein said array is configured such that two or more pixels in a given row can be gated to a sense node for each column, and the method provides two different integration times to a first and second pixel of said two or more pixels, the method including (a) providing clock signal to a plurality of digital counter/latch/shift register elements each associated with a respective one of said columns; (b) gating the first of said pixels; (c) comparing the value of the first pixel with said ramp output signal; (d) accumulating a count on said digital counter/latch/shift register element based on the comparison thereof; (e) gating the second of said pixels; (f) comparing the value of the second pixel with said ramp output signal; and (g) accumulating a count on top of the count on the digital counter/latch/shift register element; resulting in a combined value on the digital counter/latch/shift register element representing the output of said first and second pixels with dynamic range enhancement.

12. The method of claim 11, wherein two or more pixels in a given row can be gated to two or more sense nodes.

13. The method of claim 11, wherein two or more pixels in a given column can be gated to two or more sense nodes.

14. The method of claim 11, wherein each said column contains two or more sense nodes.

15. The method of claim 11 wherein said steps (a) to (g) are repeated for a total of a predetermined number of repetitions, such that the accumulated counted value on said digital counter/latch/shift register element represents an oversampled output of the first and second pixels, with dynamic range enhancement and noise reduction.

16. The method of claim 11, wherein said array is configured such that pixels from different columns can be switched to a common sense node.

17. The method of claim 11, further comprising preloading a predetermined count onto said digital counter/latch/shift register elements.

18. The method of claim 17, wherein different predetermined counts are associated with different respective pixels.

19. Method of obtaining a digital video signal from an array of pixels, each providing an analog pixel video value after a given integration period, the array being configured into a plurality of columns and at least one row; the method comprising obtaining a digital video value of at least one of said pixels in each said column; storing the digital video values within the respective columns; and prior to a new integration period repeating the steps of obtaining the digital video value for each column and storing the digital video value for a total number of repetitions within the respective column, such that the stored value in each of said columns is the sum of the digital video values of the total number of repetitions.

20. The method of claim 19, comprising within a given column combining the digital video values of two or more different pixels having different integration times.

21. The method of claim 19, further comprising preloading a predetermined count, and combining within a given column the preloaded count with each of the stored digital video values of the one or more pixels.

22. The method of claim 21, wherein there are different preload digital counts associated with different respective pixels.

23. The method of claim 19, comprising combining the digital video values of two or more different pixels having different gains.

24. Method of obtaining a digital video signal from an array of pixels, each providing an analog pixel value after a respective integration period, the array being configured into a plurality of columns and at least one row; the method comprising obtaining the digital video value of a first of said pixels for at least selected ones of said columns; storing the digital video values thereof in respective digital storage devices within said at least selected ones of said columns; connecting at least a second, different pixel in said array to a sense node for each of said selected ones of said columns; obtaining the digital video value thereof; and combining the digital video value of said second pixel with the digital video value of said first pixel that is stored within the respective column; and reading out the combined stored value for each column to obtain an output video signal.

25. The method of claim 24, wherein the first pixel and the second pixel have different integration times.

26. The method of claim 24, wherein said first pixel and said second pixel are provided with different gains.

27. The method of claim 24, comprising preloading a predetermined preload digital value into said storage device, and combining the preload digital value with the combined stored value that is stored therein.

28. The method of claim 27, wherein there are different preload values for different ones of the pixels in said array.

* * * * *

UNITED STATES PATENT AND TRADEMARK OFFICE
CERTIFICATE OF CORRECTION

| | |
|---|---|
| PATENT NO. | : 8,169,517 B2 |
| APPLICATION NO. | : 11/974813 |
| DATED | : May 1, 2012 |
| INVENTOR(S) | : Thomas Poonnen et al. |

It is certified that error appears in the above-identified patent and that said Letters Patent is hereby corrected as shown below:

Col. 9, line 50:  "2N" should read --$2^N$--

Col. 17, line 45:  "(FIG. 16D" should read --(FIG. 16I)--

Col. 20, line 23:  "(FIG. 19D" should read --(FIG. 19I)--

Signed and Sealed this
Third Day of July, 2012

David J. Kappos
*Director of the United States Patent and Trademark Office*